(12) United States Patent
Suguro et al.

(10) Patent No.: US 7,772,671 B2
(45) Date of Patent: Aug. 10, 2010

(54) SEMICONDUCTOR DEVICE HAVING AN ELEMENT ISOLATING INSULATING FILM

(75) Inventors: Kyoichi Suguro, Yokohama (JP);
Kiyotaka Miyano, Yokohama (JP);
Ichiro Mizushima, Yokohama (JP);
Yoshitaka Tsunashima, Yokohama (JP);
Takayuki Hiraoka, Sagamihara (JP);
Yasushi Akasaka, Yokohama (JP);
Tsunetoshi Arikado, Tokyo (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 230 days.

(21) Appl. No.: 12/068,635

(22) Filed: Feb. 8, 2008

(65) Prior Publication Data
US 2008/0224252 A1   Sep. 18, 2008

Related U.S. Application Data

(62) Division of application No. 10/623,732, filed on Jul. 22, 2003, now abandoned, which is a division of application No. 09/609,107, filed on Jun. 30, 2000, now Pat. No. 6,617,226.

(30) Foreign Application Priority Data

Jun. 30, 1999   (JP) .................................. 11-187053
Sep. 17, 1999   (JP) .................................. 11-263742

(51) Int. Cl.
*H01L 29/00*   (2006.01)
(52) U.S. Cl. ....................... 257/506; 257/510; 257/513; 257/410; 257/368; 257/66; 257/347; 257/374; 257/520; 257/E29.021
(58) Field of Classification Search ................. 257/506, 257/510, 513, 410, 368, 66, 347, 374, 520, 257/E29.021
See application file for complete search history.

(56) References Cited

U.S. PATENT DOCUMENTS 5,306,940 A   4/1994   Yamzaki (Continued)

FOREIGN PATENT DOCUMENTS

JP   59-195841   11/1984

(Continued)

OTHER PUBLICATIONS

Final Notice of Rejection mailed Jul. 1, 2008 from the Japanese Patent Office for a corresponding Japanese Patent Application No. 2004-137525.

(Continued)

*Primary Examiner*—Tu-Tu V Ho
(74) *Attorney, Agent, or Firm*—Finnegan, Henderson, Farabow, Garrett & Dunner, L.L.P.

(57) ABSTRACT

A semiconductor device including a semiconductor substrate having on its surface a recess and at least one projection formed in the recess. The projection has a channel region and an element isolating insulating film is formed in the recess. A MIS type semiconductor element is formed on the semiconductor substrate and includes a gate electrode formed on the channel region of the projection via a gate insulating film. Source and drain regions are formed to pinch the channel region of the projection therebetween. A channel region of the MIS type semiconductor element is formed to reach the at least one projection located adjacent to the MIS type semiconductor element in its channel width direction via the recess. A top surface of the at least one projection is located higher than the top surface of the element isolating insulating film by 20 nm or more.

4 Claims, 20 Drawing Sheets

U.S. PATENT DOCUMENTS

| | | | |
|---|---|---|---|
| 5,534,459 A | 7/1996 | Kim | |
| 5,567,962 A | 10/1996 | Miyawaki et al. | |
| 5,895,248 A | 4/1999 | De Boer et al. | |
| 5,950,097 A | 9/1999 | Chang et al. | |
| 5,963,822 A | 10/1999 | Saihara et al. | |
| 6,087,706 A | 7/2000 | Dawson et al. | |
| 6,118,161 A * | 9/2000 | Chapman et al. | 257/401 |
| 6,326,293 B1 | 12/2001 | Fang et al. | |
| 6,426,532 B1 | 7/2002 | Iwata et al. | |

FOREIGN PATENT DOCUMENTS

| | | |
|---|---|---|
| JP | 60-60734 | 4/1985 |
| JP | 60-257541 | 12/1985 |
| JP | 61-18148 | 1/1986 |
| JP | 62-66619 | 3/1987 |
| JP | 63-305529 | 12/1988 |
| JP | 1-276669 | 11/1989 |
| JP | 2-130852 | 5/1990 |
| JP | 2-142117 | 5/1990 |
| JP | 2-189976 | 7/1990 |
| JP | 3-296247 | 12/1991 |
| JP | 4-37048 | 2/1992 |
| JP | 05-013566 | 1/1993 |
| JP | 5-109762 | 4/1993 |
| JP | 5-211230 | 8/1993 |
| JP | 6-53313 | 2/1994 |
| JP | 7-245340 | 9/1995 |
| JP | 09-045900 | 2/1997 |
| JP | 09-97838 | 4/1997 |
| JP | 09-148426 | 6/1997 |
| JP | 09-181194 | 7/1997 |
| JP | 09-213785 | 8/1997 |
| JP | 9-252129 | 9/1997 |
| JP | 09-312331 | 12/1997 |
| JP | 10-189711 | 7/1998 |
| JP | 10-189966 | 7/1998 |
| JP | 10-261588 | 9/1998 |
| JP | 11-26574 | 1/1999 |
| JP | 11-145020 | 5/1999 |
| JP | 11-163325 | 6/1999 |

OTHER PUBLICATIONS

Notification of Reasons for Rejection mailed Oct. 16, 2007 from the Japanese Patent Office for counterpart Japanese Patent Application No. 2004-137525.

* cited by examiner

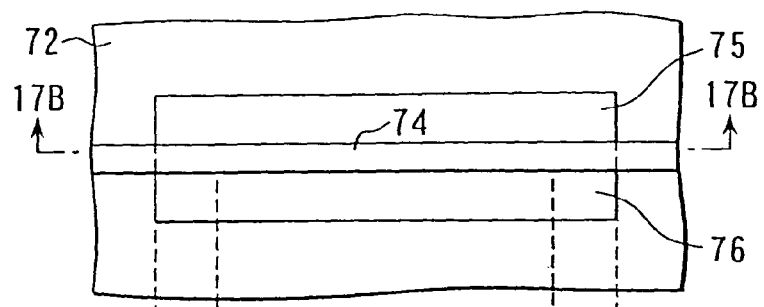
FIG. 17A
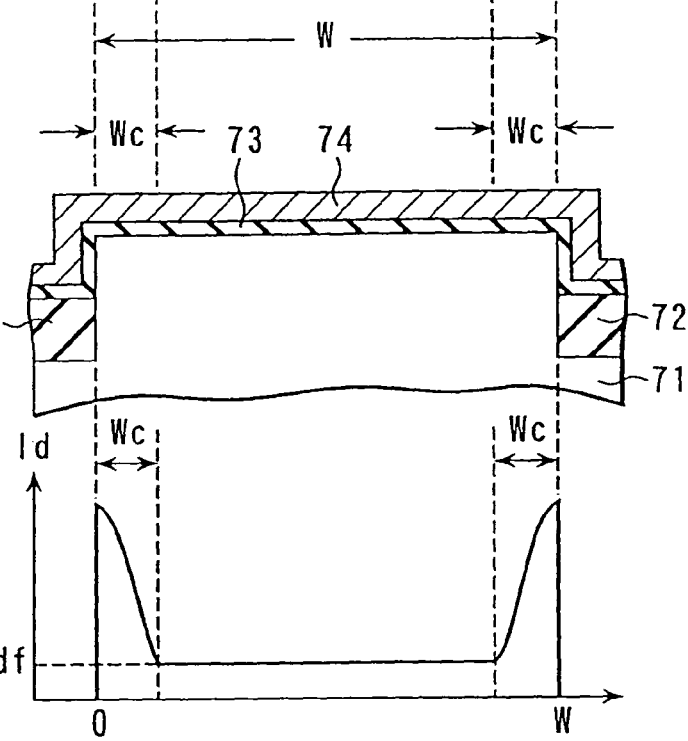
FIG. 17B
FIG. 17C
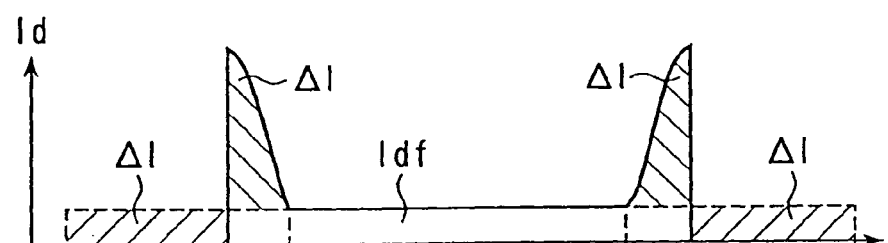
FIG. 18A
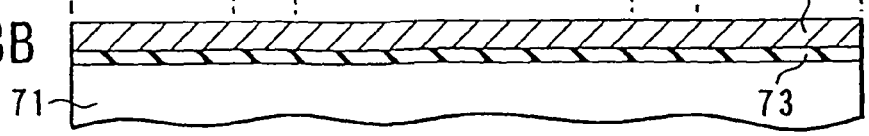
FIG. 18B

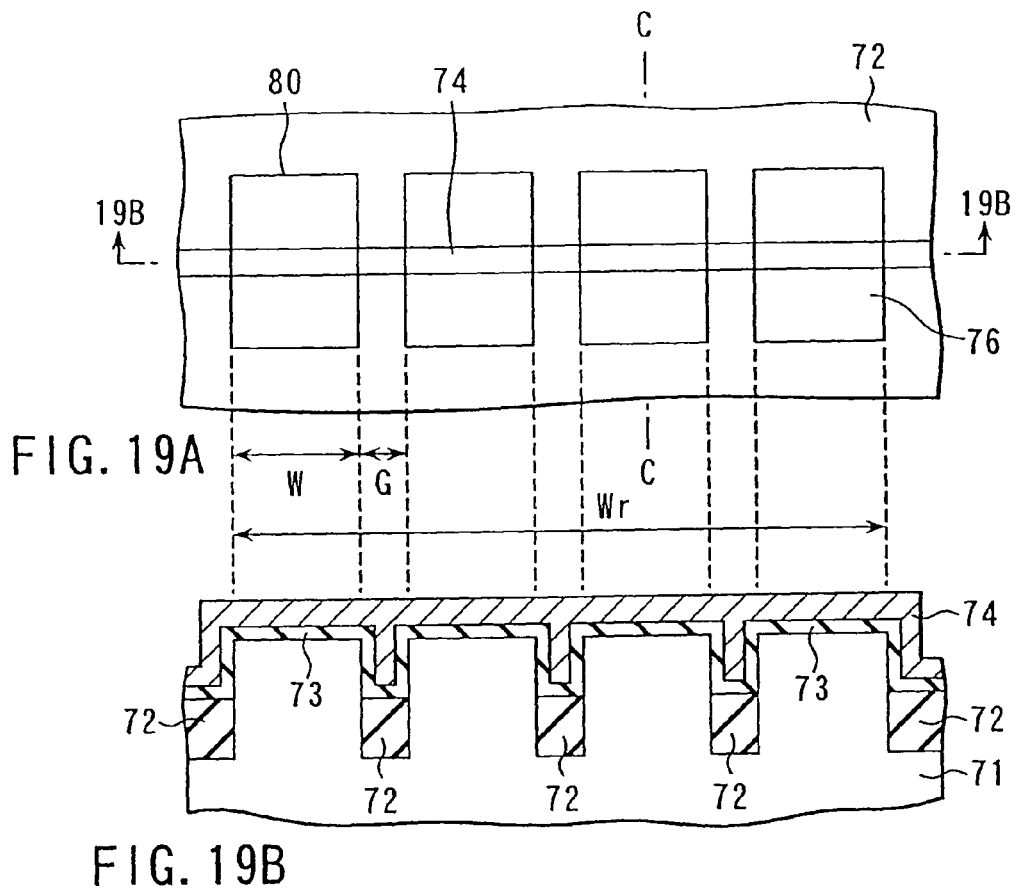
FIG. 19A
FIG. 19B
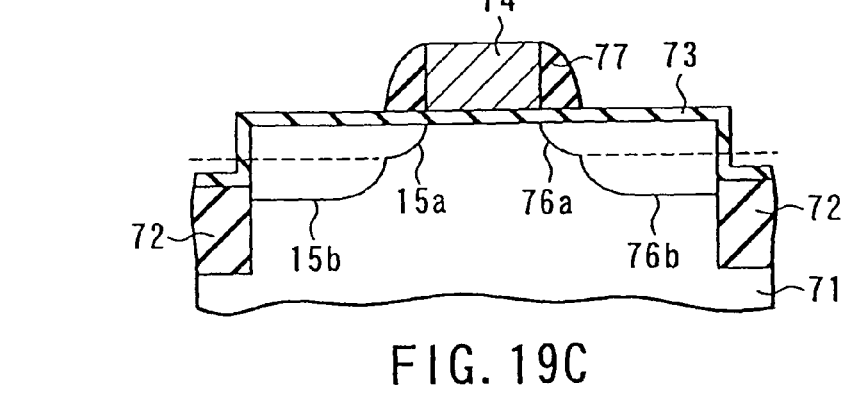
FIG. 19C

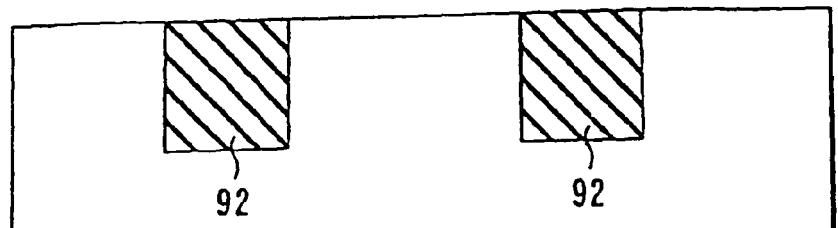
FIG. 20A PRIOR ART
FIG. 20B PRIOR ART
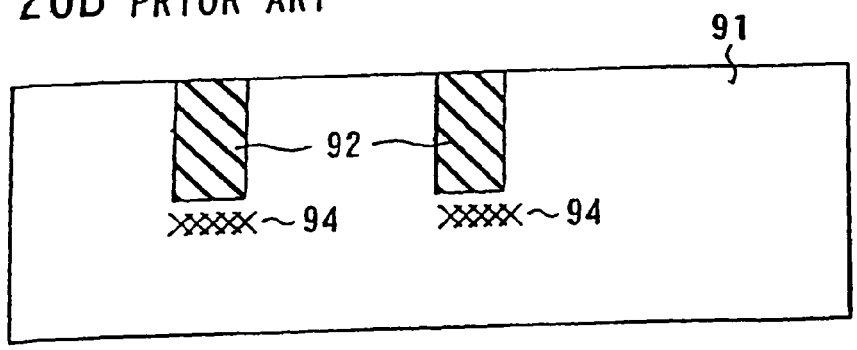
FIG. 21 PRIOR ART
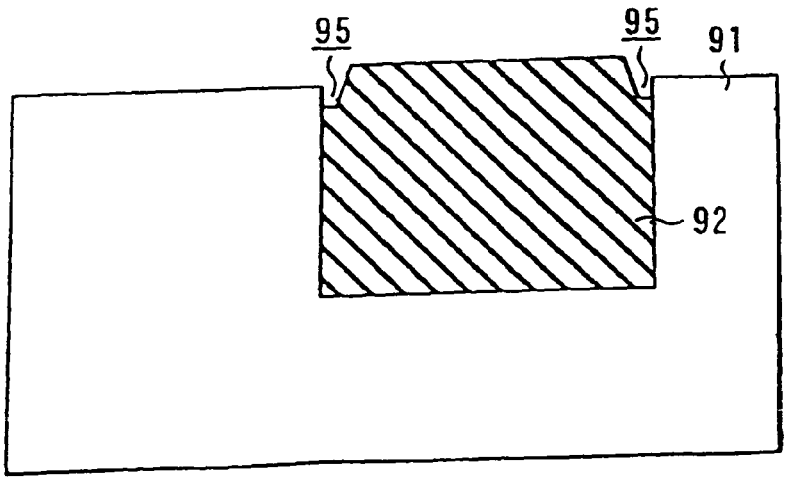
FIG. 22 PRIOR ART

SEMICONDUCTOR DEVICE HAVING AN ELEMENT ISOLATING INSULATING FILM

CROSS-REFERENCE TO RELATED APPLICATIONS

This application is a divisional of U.S. application Ser. No. 10/623,732, filed Jul. 22, 2003, now abandoned which is a divisional of U.S. application Ser. No. 09/609,107, filed Jun. 30, 2000, now U.S. Pat. No. 6,617,226, which is based upon and claims the benefit of priority from prior Japanese Patent Applications No. 11-187053, filed Jun. 30, 1999; and No. 11-263742, filed Sep. 17, 1999, the entire contents of which are incorporated herein by reference.

BACKGROUND OF THE INVENTION

Integral parts of recent computers and communication equipment often comprise large-scale integrated circuits (LSI) formed by electrically connecting a large number of transistors, resistors, and the like together so as to form an electric circuit and integrating the circuit on one chip. Thus, the performance of the entire equipment heavily depends on the performance of the unitary LSI. The performance of the unitary LSI can be improved by increasing the degree of integration, that is, reducing the size of elements.

For example, in MOS transistors, the size of elements can be reduced by reducing gate length and the thickness of a source/drain diffusion layer (region).

The low-acceleration ion implantation method is widely used to form a shallow source/drain diffusion layer. This method enables formation of a shallow source/drain diffusion layer of thickness 0.1 μm or less.

Since, however, the source/drain diffusion layer formed by the low-acceleration ion implantation method has a high sheet resistance of 100Ω or more, elements simply having their thickness reduced in this manner are not expected to operate at an increased speed.

Thus, devices such as logic LSIs which require high speeds employ the salicide technique of forming a silicide film on a surface of the source/drain diffusion layer and a surface of a gate electrode (a polycrystalline silicon film doped with impurities) in a self-alignment manner.

To form a dual-gate MOS transistor (an n-channel MOS transistor and a p-channel MOS transistor formed on the same substrate wherein a gate electrode of the n-channel MOS transistor comprises a polycrystalline silicon film doped with n-type impurities and a gate electrode of the p-channel MOS transistor comprises a polycrystalline silicon film doped with p-type impurities), the salicide technique can reduce not only the resistance of the gate electrodes but also the number of required steps.

This is because the gate electrodes (the polycrystalline silicon films) can be doped with impurities of a predetermined conductivity type in an ion implantation step for forming the source/drain diffusion layer.

On the contrary, to form a dual-gate MOS transistor employing a structure having a metal silicide film such as a W silicide film laminated on a polycrystalline silicon film doped with polycide impurities, the polycrystalline silicon film is masked with the metal silicide film in the ion implantation step for forming the source/drain diffusion layer, so that the polycrystalline silicon film cannot be doped with impurities of a predetermined conductivity type.

Accordingly, the polycrystalline silicon film must be doped with impurities of a predetermined conductivity type before formation of the source/drain diffusion layer. That is, separate ion implantation steps are required to form the source/drain diffusion layer and to dope the polycrystalline silicon film with impurities of a predetermined conductivity type, thereby increasing the number of required steps.

Specifically, this method requires two more photolithography steps, two more ion implantation steps, and two more resist removal steps than the salicide technique.

On the other hand, in devices such as memory LSIs in DRAMs or the like which require elements to be densely integrated and formed, a SAC (Self-Aligned Contact) structure is essential.

One of processes for forming the SAC structure etches an interlayer insulating film on one side of the source/drain diffusion layer (that is typically used as a source) by means of the RIE (Reactive Ion Etching) method to form contact holes for the source/drain diffusion layer.

In this case, a surface of the gate electrode (the polycrystalline silicon film) must be prevented from being exposed even if the contact holes are misaligned. To achieve this, a silicon nitride film is formed on the gate electrode as an etching stopper film in advance.

Such a silicon nitride film precludes impurities from being injected into the gate electrode in the ion implantation step for forming the source/drain diffusion layer. Consequently, the memory LSIs reject the salicide technique, as used for the logic LSIs.

The memory LSIs conventionally commonly use a gate electrode (a polycrystalline silicon gate electrode) comprising a polycrystalline silicon film doped with impurities and also use a polycide gate electrode due to the need to reduce resistance.

If a gate electrode having a lower resistance is required, a polymetal gate electrode is used which is formed by sequentially laminating a polycrystalline silicon film doped with impurities, a barrier metal film, and a metal film such as a W films. Since the polymetal has a lower resistance than the polycide gate electrode, it achieves a desired sheet resistance with a smaller thickness.

The polymetal gate electrode, however, has the following problems: The logic LSIs use the above described dual-gate structure. Thus, if the logic LSI uses the polymetal gate electrode, separate steps are required to ion-inject impurities into a polycrystalline silicon film of the polymetal gate electrode and to ion-inject impurities into a silicon substrate to form the source/drain diffusion layer, as with the polycide gate electrode, thereby increasing the number of required steps and thus manufacturing costs.

In an LSI with logic ICs and DRAMS mixed together, if the silicide film is formed on the surface of the source/drain diffusion layer, a pn junction leak-current from memory cells increases to prevent retention of data. In addition, the DRAM uses a W polycide electrode because of the needs for the SAC structure as described above.

On the other hand, the logic LSI must have a low threshold voltage for the MOS transistors in order to maximize current at a low voltage. Thus, the polycrystalline silicon film of the gate electrode of the n-channel MOS transistor is doped with n-type impurities such as P or As so as to be formed into an $n^-$ type, while the polycrystalline silicon film of the gate electrode of the p-channel MOS transistor is doped with p-type impurities such as $BF_2$ so as to be formed into a $p^+$ type.

To improve the performance of the transistor, it is insufficient to simply reduce the resistances of the source, drain, and gate, and reducing variations in transistor characteristics is very important. One of the major causes of the variations in characteristics is variations in threshold voltage.

Next to variations in processing dimensions, the shape of an element-isolating insulating film at ends of element regions has the largest effect on the variances in threshold voltage. For highly integrated circuits with elements separated mutually by about 0.3 μm or less, STI (Shallow Trench Isolation) is commonly used; that is, trenches (element isolating grooves) are formed to a depth of 0.2 to 0.3 μm, the CVD method is subsequently used to deposit an oxide film all over a surface of a substrate in such a manner as to embed the oxide film in the trenches, and chemical mechanism polishing (CMP) is then used to remove unwanted portions of the oxide film outside each of the trenches in order to isolate the elements.

A TEOS/ozone-based CVD-$SiO_2$ film is conventionally used for the embedding. If trenches (element isolating grooves) formed in a silicon substrate 91 have an aspect ratio between about 1 and 1.5, an oxide film 92 can be embedded in the trenches without creating voids.

If, however, the aspect ratio of the trenches is larger than 1.5 due to the reduced size of the elements, it becomes difficult to embed the oxide film in the trenches without a gap. Voids 93 may be created in the middle of the oxide film, resulting in an incomplete embedded shape, as shown in FIG. 20B.

When the voids 93 are formed, moisture is likely to be absorbed in these gaps to facilitate humidification, thereby degrading the element characteristics. Furthermore, formation of the voids 93 and the level of humidification may vary, so that the voids 93 may vary the element characteristics.

To solve this problem, an embedding method using HDP plasma TEOS has been proposed. With the aspect ratio beyond 2 to 2.5, however, the oxide film has an incomplete embedded shape, also resulting in the voids 93 as shown in FIG. 20B.

When the oxide film 92 is formed while the deposited oxide film is being etched under the application of a substrate bias, the oxide film 92 has an appropriate embedded shape but crystal defects 94 may occur in portions of the substrate surface corresponding to bottoms of the trenches as shown in FIG. 21, thereby degrading the element characteristics. Furthermore, the level of the crystal defects 94 varies, so that the crystal defects 94 varies the element characteristics.

In the STI described in FIGS. 20A and 20B and FIG. 21, the oxide film (the deposited insulating film) 92 is etched at a high rate, so that during a plurality of wet etching steps in an LSI manufacturing process which use a diluted hydrofluoric acid or a diluted ammon fluoride, divots 95 may be formed at upper edges of the trenches as shown in FIG. 22.

In this case, the gate electrode may cut into each of the divots 95 to form at this position a transistor having an apparently low threshold voltage (a corner transistor). Since the depth and shape of the divot 95 have a pattern dependency, the threshold voltage of the corner transistor vary significantly with gate width to vary the threshold voltage of the original MOS transistor. Furthermore, the corner transistor may cause humps as shown in FIG. 23, thereby degrading the element characteristics. Additionally, the depth and shape of the divots 95 are not uniform within a wafer surface, thereby further increasing the variations in element characteristics.

To solve this problem, a thermal oxide film 96 is disposed in an interface between the element region and the element isolating region as shown in FIG. 24. The thermal oxide film 96 reduces the variations, but due to the high rate at which the oxide film 92 is etched, the oxide film 92 and the oxide film 96 recede at a top of the trench as shown in FIG. 24, thereby disadvantageously varying the threshold voltage.

In addition, as shown in FIG. 25, a method has been proposed which first forms the oxide film 92 on the silicon substrate 91 and then uses etching to remove regions of the oxide film 92 corresponding to the element regions, followed by epitaxial growth using as a seed portions of a substrate surface (Si) exposed by means of the etching, to selectively grow a silicon layer 97 in the element regions. This method, however, may form facets 98 (oblique crystal faces), into which the gate electrode may cut, resulting in a problem similar to that with the structure with the divots 95 shown in FIG. 22.

Since loads such as wiring increase consistently with the degree of integration of the LSIs, a current driving capability of the MIS transistor is desirably improved. To improve the current driving capability, the channel length L of the MIS transistor may be reduced or the channel width W thereof may be increased.

To reduce the channel length, an advanced lithography technique, a low-acceleration ion implantation technique, a highly controlled impurity activation technique, or the like must be developed, and high costs are required for such development. In addition, if the channel width is increased, the region occupied by the transistor increases to augment the chip region.

As described above, due to the increased degree of integration of the LSIS, the current driving capability of the MIS transistor is desirably improved, but advanced techniques must be developed to reduce the channel length of the transistor. Disadvantageously, if the channel length of the transistor is increased, the region occupied by the transistor increases.

BRIEF SUMMARY OF THE INVENTION

As described above, the element isolation called the "STI" is carried out for the highly integrated circuits, but when the aspect ratio of the trenches (the element isolating grooves) increases linearly with the size of the elements, it becomes difficult to form an insulating film in the trenches so as to have an appropriate embedded shape, thereby disadvantageously varying the element characteristics.

The present invention is provided in view of the above circumstances, and it is an object thereof to provide a method for manufacturing a semiconductor device that can restrain variations in element characteristics and that enables elements to isolated using the STI. It is another object of the present invention to provide a semiconductor device having MOS type elements and which restrains variations in element characteristics.

To attain these objects, a method for manufacturing a semiconductor device according to the present invention comprises the steps of forming an insulating film on a semiconductor substrate, forming openings in the insulating film to partly expose a surface of the semiconductor substrate, using the exposed portion as a seed to epitaxially grow and form a semiconductor layer of thickness sufficient to fill the openings and to extend upward above the insulating film, and removing portions of the semiconductor layer outside the openings.

Another method for manufacturing a semiconductor device according to the present invention comprises the steps of forming a monocrystalline insulating film on a semiconductor substrate, forming a non-monocrystalline insulating film on the monocrystalline insulating film, forming openings in the non-monocrystalline insulating film to partly expose a surface of the semiconductor substrate, using the exposed portion as a seed to epitaxially grow and form a semiconductor layer of thickness sufficient to fill the openings and to extend upward above the insulating film, and removing portions of the semiconductor layer outside the openings.

According to this method for manufacturing a semiconductor device, the epitaxial growth is used to fill the openings with the semiconductor layer, thereby preventing creation of voids, which may cause variations. Furthermore, the semiconductor layer is formed to extend upward from the openings above the insulation film, thereby preventing formation of facets, which may vary the element characteristics. Therefore, the STI can be used to isolate the element to restrain the variations in element characteristics.

Yet another method for manufacturing a semiconductor device according to the present invention comprises the steps of forming an insulating film on a semiconductor substrate, forming openings in the insulating film to partly expose a surface of the semiconductor substrate, using the exposed portion as a seed to epitaxially grow and form in the openings a semiconductor layer that is not thick enough to reach an opening surface of each of the openings, and heating the semiconductor layer in an inert gas atmosphere.

According to this method for manufacturing a semiconductor device, the openings are filled with the epitaxially grown semiconductor layer, thereby preventing creation of voids, which may cause variations. In this case, since the semiconductor layer has its top surface formed to be lower than the opening surfaces of the openings, facets may be formed. The subsequent heating, however, flattens the surface of the semiconductor layer to eliminate the facets, which may vary the element characteristics. This method thus enables the element to be isolated based on the STI while restraining the variations in element characteristics.

In addition, a semiconductor device according to the present invention comprises a substrate having a semiconductor layer, an element isolating insulating film for partitioning the semiconductor layer into a plurality of element regions, the element isolating insulating film being formed on the substrate so as to penetrate the semiconductor layer and having a top surface projecting upward above a surface of the semiconductor layer, and a MOS type element formed within a corresponding one of the element regions and having a gate insulating film, wherein a difference in height from the substrate between the top surface position of the element isolating insulating film and the top surface position of the semiconductor layer is at least three times as large as the thickness of the gate insulating film.

Another semiconductor device according to the present invention comprises a substrate having a semiconductor layer, an element isolating insulating film for partitioning the semiconductor layer into a plurality of element regions, the element isolating insulating film being formed on the substrate so as to penetrate the semiconductor layer and having a top surface projecting upward above a surface of the semiconductor layer, and a MOS type element formed within a corresponding one of the element regions, wherein a difference in height from the substrate between the top surface position of the semiconductor layer and the top surface position of the element isolating insulating film is at least 10 nm.

When the difference between the top surface position of the element isolating insulating film and the top surface position of the semiconductor layer with the MOS type elements formed thereon (the semiconductor layer in the element regions) as in the semiconductor devices according to the present invention, variations in element characteristics, particularly, variations in threshold voltage can be effectively restrained, as described in detail in the embodiment section.

It is another object of the present invention to provide a semiconductor device including a MIS type transistor and which can enhance a current driving capability with the same channel length.

To attain this object, a semiconductor device according to the present invention comprises a semiconductor substrate having on its surface a recess and at least one projection formed in the recess, the projection having a channel region, an element isolating insulating film formed in the recess, a MIS type semiconductor element formed on the semiconductor substrate and including a gate electrode formed on the channel region of the projection via a gate insulating film, and a source and a drain regions formed to pinch the channel region of the projection therebetween, wherein a channel region of the MIS type semiconductor element is formed to reach the at least one projection located adjacent to the MIS type semiconductor element in its channel width direction via the recess, and a top surface of the at least one projection is located higher than the top surface of the element isolating insulating film.

Another semiconductor device according to the present invention comprises a semiconductor substrate having a recess and projections formed on its surface, an element isolating insulating film formed in the recess and having its top surface below top surfaces of the projections, and a MIS type semiconductor element using a region of the semiconductor substrate as a channel region and including a gate electrode formed on the channel region via a gate insulating film, and a source and a drain regions formed to pinch the channel region therebetween, wherein the channel region of the MIS semiconductor element is divided into at least two sections in the channel width direction by means of the element isolating insulating film and has first regions near steps between the recess and the projections and second regions corresponding to the projections between the first regions, and $W_i - W_t > G_t$ where $G_t$ denotes the sum of the widths of the recess in the channel with direction, $W_t$ denotes the sum of the widths of the projections in the channel with direction, and $W_i$ denotes an assumed channel width of an assumed semiconductor element in which its channel width is equal to that of the MIS type semiconductor element, in which the current density of a current through its channel region is equivalent to that of a current through the second regions of the MIS type semiconductor element, and in which the total current through its channel region is equivalent to that through the channel region of the MIS type semiconductor element.

According to the semiconductor device of the present invention, the channel region is divided by the isolating insulating film having its top surface below the top surfaces of the projections, thereby increasing the current density of a current through the channel region near the steps between the recess and the projections.

By assuming a semiconductor element taking an increase in current near the steps into account and configuring the element so that Wi−Wt>Gt where Wi denotes an assumed channel width of this assumed semiconductor element, Gt denotes the sum of the widths of the recess in the channel with direction, and Wt denotes the sum of the widths of the projections in the channel with direction, the current driving capacity can be enhanced compared to conventional elements, without increasing the region occupied by the element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 17A, 17B and 17C are diagrams showing a basic principle of the present invention;

FIGS. 18A and 18B are diagrams showing an effective increase in channel width of the element shown in FIGS. 17A to 17C;

FIGS. 19A, 19B and 19C are diagrams showing a preferred embodiment of the present invention;

FIGS. 20A and 20B are sectional views useful in explaining problems with a conventional element isolating method based on the STI;

FIG. 21 is a sectional view useful in explaining problems with another conventional element isolating method based on the STI;

FIG. 22 is a sectional view showing divots that may be formed in the conventional element isolating methods in FIGS. 20A, 20B and 21;

DETAILED DESCRIPTION OF THE INVENTION

Embodiments of the present invention will be described below with reference to the drawings.

First Embodiments

FIGS. 1A to 1E are process sectional views showing a method for forming an element isolating structure according to a first embodiment of the present invention.

Figure 1A:
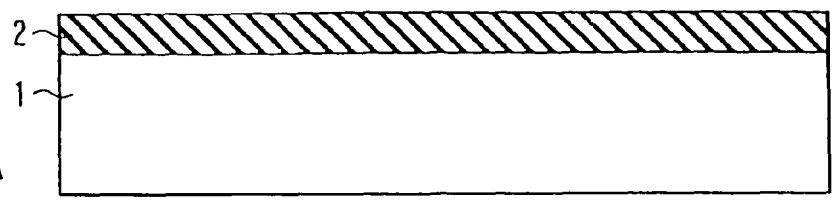
FIGS. 1A, 1B, 1C, 1D and 1E are process sectional views showing a method for forming an element isolating structure according to a first embodiment of the present invention.

First, as shown in FIG. 1A, a thermal oxide film 2 is formed on a monocrystalline silicon substrate 1 as an element isolating insulating film. Thermal oxidation for forming the thermal oxide film 2 is carried out in an atmosphere at 90° C. or higher, typically, a water vapor/oxygen atmosphere to obtain a dense thermal oxide film 2 that is etched at a low rate using hydrofluoric acid or ammon fluoride. The oxide film 2 with a lower etching rate is obtained by means of thermal oxidation in a high-pressure oxidizing atmosphere of 10 atm or more.

Figure 1B:
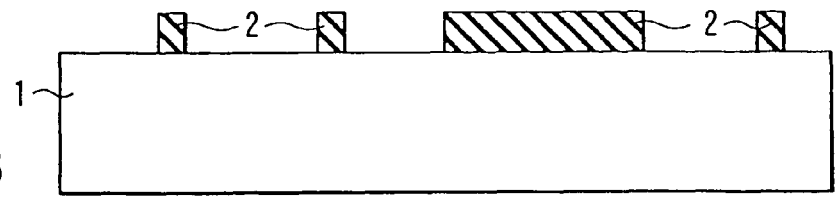

Next, as shown in FIG. 1B, photolithography and anisotropic etching are used to selectively remove those portions of the thermal oxide film 2 that correspond to element forming regions, to form openings in the thermal oxide film 2.

Then, a photo resist may be exposed using, for example, a Krf or an Arf excimer laser, and the anisotropic etching may be RIE.

Next, a contaminated layer comprising carbon or fluorine and located on portions of a substrate surface corresponding to bottom surfaces of the openings is oxidized, and the native oxide film on the portions of the substrate surface corresponding to the bottom surfaces of the openings is then removed using a diluted hydrofluoric acid or diluted ammon fluoride. Subsequently, the native oxide film on the portions of the substrate surface corresponding to the bottom surfaces of the openings is further removed by means of thermal treatment in a hydrogen-containing gas atmosphere.

Figure 1C:
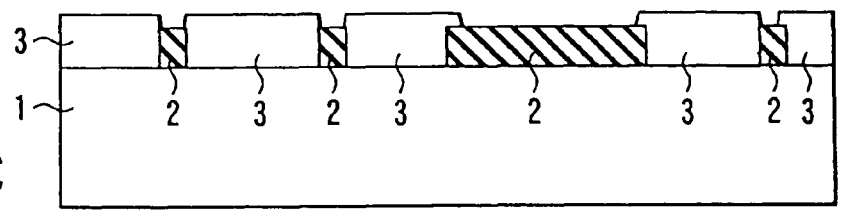

Next, as shown in FIG. 1C, the exposed substrate surface is used as a seed to selectively grow an epitaxial layer 3 on a silicon substrate 1. The epitaxial layer 3 is selectively grown so as to be thicker than the thermal oxide film 2 and to extend upward above the thermal oxide film 2.

The epitaxial layer 3 is a silicon layer, a silicon germanium layer (an alloy film obtained by forming a solid solution of germanium and silicon so that the concentration of the germanium is 10 to 90% of that of the silicon), or a germanium layer.

A silicon source gas is typically dichlorosilane. In addition, if the film formation device sets partial pressures of residual water vapor and oxygen both at $10^{-9}$ Torr or lower, monosilane, disilane, or trisilane may be used.

A germanium source gas is germane (GeH4) or germane tetrafluoride (GeF4). The silicon germanium layer may be formed by any combination of source gases and typically comprises a combination of monosilane and germane.

HCl may be added to ensure the selective growth. The epitaxial growth temperature is between 700 and 1,100° C., and the film may be formed under desired conditions depending on the gas type and the thickness and quality of the deposited film.

Figure 1D:
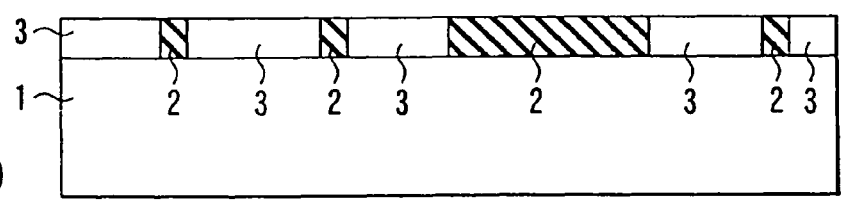

Next, as shown in FIG. 1D, CMP or mechanical polishing (MP) is used to remove unwanted portions of the epitaxial layer 3 outside the openings in the thermal oxide film 2 to flatten a surface of the epitaxial layer 3.

Figure 1E:
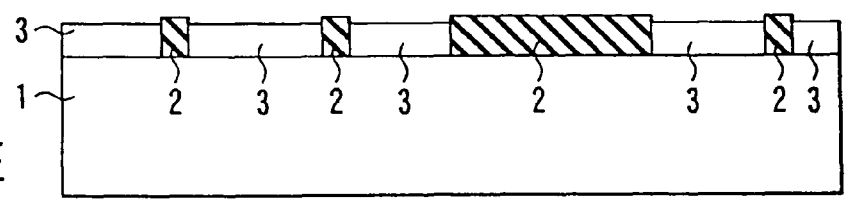

Next, as shown in FIG. 1E, the surface of the epitaxial layer 3 remaining in the element forming regions is etched about 10 to 50 nm to remove a crystal damaged layer formed on the surface of the epitaxial layer 3 in the step in FIG. 1D. As a result, the surface of the epitaxial layer 3 is below a surface of the thermal oxide film 2.

The above etching is wet etching using, for example, a liquid obtained by using acetic acid or pure water to dilute a liquid comprising nitric acid and 10% or less of hydrofluoric acid mixed together, if the epitaxial layer 3 comprises a silicon or silicon germanium.

In addition, with a germanium layer, this wet etching uses a liquid obtained by using acetic acid or pure water to dilute a liquid comprising nitric acid and 10% or less of hydrofluoric acid mixed together, or uses sulfuric acid (the etching rate is controlled as required by means of, for example, heating or dilution with water).

Finally, the substrate is subjected to thermal treatment in a hydrogen-containing atmosphere to flatten the surface of the epitaxial layer 3 at the level of an atomic layer, and distortion in an interface between the thermal oxide film 2 and the epitaxial layer 3 is diminished to reduce interface level density down to $5 \times 10^{10}$ cm$^{-2}$ or less. Subsequently, a desired semiconductor element, for example, a MOS transistor is formed on the epitaxial layer 3, as in the prior art.

As described above, according to this embodiment, the openings are filled with the epitaxial layer 3 to prevent formation of voids, which may cause variations, and the epitaxial layer 3 is formed to extend upward from the openings above the thermal oxide film 2 to prevent creation of facets, which may cause variations. Thus, this embodiment can implement an element isolating structure that can effectively restrain variations in element characteristics despite a further reduction in element size.

Although in this embodiment, the surface of the epitaxial layer 3 is below the surface of the thermal oxide film 2, the surface of the thermal oxide layer 2 may be below the surface of the epitaxial layer 3 or these surfaces may be at the height. That is, since voids and facets, which may cause variations, can be precluded by selectively growing the epitaxial layer 3 so as to be thicker than the thermal oxide film 2 and to extend upward above the thermal oxide film 2 and then removing unwanted portions of the epitaxial layer 3, the final element isolating structure may be selected as appropriate.

When MOS transistors were measured for threshold voltage with respect to gate processing size (gate length), the threshold voltage was found to decrease significantly in a short channel region.

When, for example, a n-channel MOS transistor having a substrate impurity concentration of $5 \times 10^{17}$ cm$^{-3}$, a gate oxide film thickness of 4.0 nm, a gate width (w) of 10 μm, source/drain diffusion layer impurity concentration of $5 \times 10^{17}$ cm$^{-3}$, and a source/drain diffusion layer junction depth (xj) of 0.15 μm was examined for dependency of the threshold voltage on channel length, the threshold voltage was found to drop sharply when the channel length was 0.2 μm or less.

Since channel conductance increases linearly with the gate length, LSI circuits desirably employ MOS transistors of a smaller gate length. A change in gate length by only 10 to 15 nm, however, changes the threshold voltage by 50 mV or more.

Thus, if such MOS transistors of a smaller gate length are employed, the threshold voltage is likely to vary due to variations in processing size, gate oxide film thickness, and source/drain diffusion layer impurity concentration distribution. This is a major cause of a decrease in LSI yield.

In the prior art, the element isolating insulating film is inappropriately shaped at an end of the element isolating region, in contrast to the present invention. Consequently, the above described variations in threshold voltage are more serious.

The MOS transistor size on which the present invention is particularly effective is 0.1 μm or less in terms of design rule for MOS transistors for use in DRAM memory cells, or 70 nm or less in terms of gate length for MOS transistors for use in CMOSs.

Second Embodiment

Figure 2A:
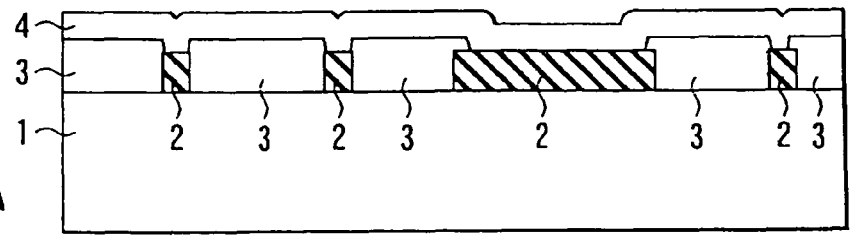
FIGS. 2A and 2B are process sectional views showing a method for forming an element isolating structure according to a second embodiment of the present invention.
Figure 2B:
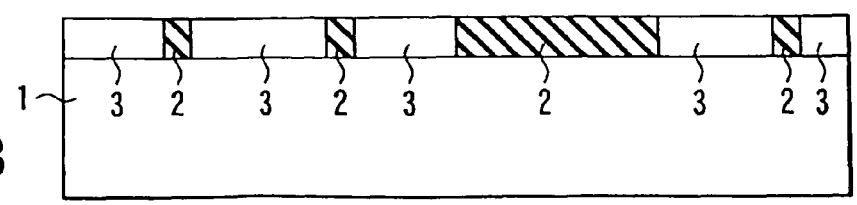

FIGS. 2A to 2B are process sectional views showing a method for forming an element isolating structure according to a second embodiment of the present invention. Those parts that correspond to FIGS. 1A to 1E are denoted by the same reference numerals as those in these figures, and their detailed description is omitted.

First, the steps shown in FIGS. 1A to 1C are carried out.

Next, as shown in FIG. 2A, a silicon film 4 is formed all over the surface of the epitaxial layer 3 to flatten the surface. A silicon germanium film or a germanium film may be formed instead of the silicon film 4.

Next, as shown in FIG. 2B, CMP or MP is used to remove portions of the silicon film 4 and epitaxial layer 3 outside the openings in the thermal oxide film 2. The thickness of the epitaxial layer 3 has a pattern dependency, that is, varies with the size of the openings in the thermal oxide film 2 or the density of the thermal oxide film 2. Since, however, the silicon film 4 serves to flatten the surface of the epitaxial layer, the pattern dependency is eliminated to sufficiently increase the flatness of the surface after the CMP or the like. The subsequent steps are the same as those after the step in FIG. 1E in the first embodiment.

Third Embodiment

FIGS. 3A to 3E are process sectional views showing a method for forming an element isolating structure according to a third embodiment of the present invention. This embodiment is an example to which the first embodiment is applied to an SOI substrate.

Figure 3A:
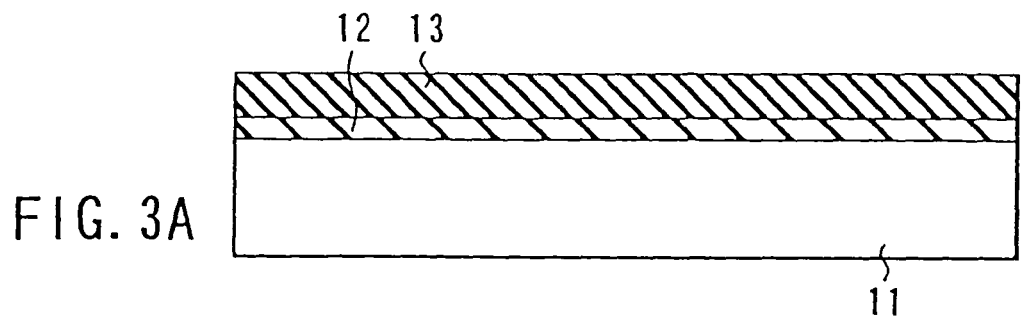
FIGS. 3A, 3B, 3C, 3D and 3E are process sectional views showing a method for forming an element isolating structure according to a third embodiment of the present invention.

First, as shown in FIG. 3A, a monocrystalline insulating film 12 comprising an insulator such as CeO$_2$, YSZ (Yttrium Stabilized Zirconia), $CaF_2$, or diamond is formed on a monocrystalline silicon substrate 11, and an oxide film 13 is formed on the monocrystalline insulating film 12 as an element isolating insulating film.

The oxide film 13 is formed by means of thermal oxidation in an oxidizing atmosphere at 900° C. or higher or by depositing and forming the film and then heating it at 900° C. or higher. Such a method provides an oxide film 13 that is etched at a low rate using hydrofluoric acid or ammon fluoride. To obtain an oxide film 13 with a lower etching rate, a material may be subjected to thermal oxidation in a high-pressure oxidizing atmosphere at 10 atm or higher.

Figure 3B:
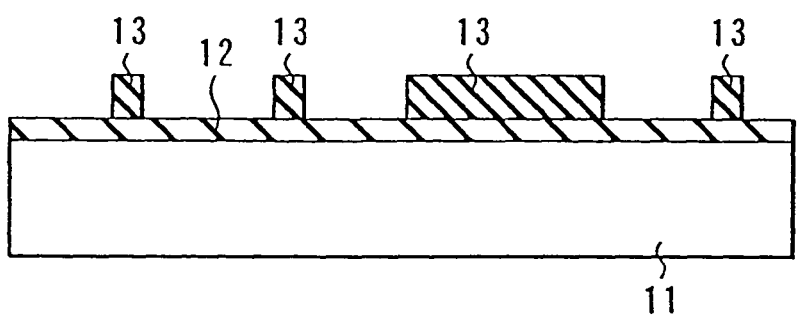

Next, as shown in FIG. 3B, photolithography and anisotropic etching are used to selectively remove those portions of the thermal oxide film 13 that correspond to element forming regions, to form openings in the thermal oxide film 13. A photo resist may be exposed using, for example, a Krf or an Arf excimer laser, and the anisotropic etching may be RIE.

Next, a contaminated layer on a surface of the monocrystalline insulating film 12 is oxidized, and the native oxide film on portions of the surface of the monocrystalline insulating film 12 corresponding to bottom surfaces of the openings is then removed using a diluted hydrofluoric acid or diluted ammon fluoride. Subsequently, the native oxide film on the portions of the surface of the monocrystalline insulating film 12 corresponding to the bottom surfaces of the openings is further removed by means of thermal treatment in a hydrogen-containing gas atmosphere.

Figure 3C:
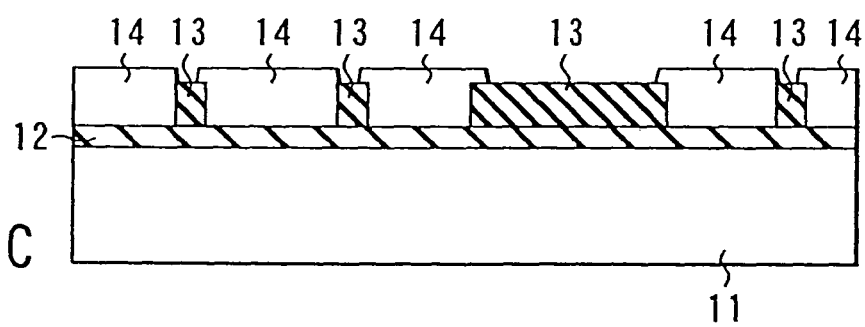

Next, as shown in FIG. 3C, the exposed surface of the monocrystalline insulating film 12 is used as a seed to selectively grow an epitaxial layer 14. The epitaxial layer 14 is selectively grown so as to be thicker than the oxide film 13 and to extend upward above the oxide film 13.

The epitaxial layer 14 is a silicon layer, a silicon germanium layer (an alloy film obtained by forming a solid solution of germanium and silicon so that the concentration of the germanium is 10 to 90% of that of the silicon), or a germanium layer.

A silicon source gas is typically dichlorosilane. In addition, if the film formation device sets partial pressures of residual water vapor and oxygen both at $10^{-9}$ Torr or lower, monosilane, disilane, or trisilane may be used.

A germanium source gas is germane (GeH4) or germane tetrafluoride (GeF4). The silicon germanium layer may be formed by any combination of source gases and typically comprises a combination of monosilane and germane.

HCl may be added to ensure the selective growth. The epitaxial growth temperature is between 700 and 1,100° C., and the film may be formed under desired conditions depending on the gas type and the thickness and quality of the deposited film.

Figure 3D:
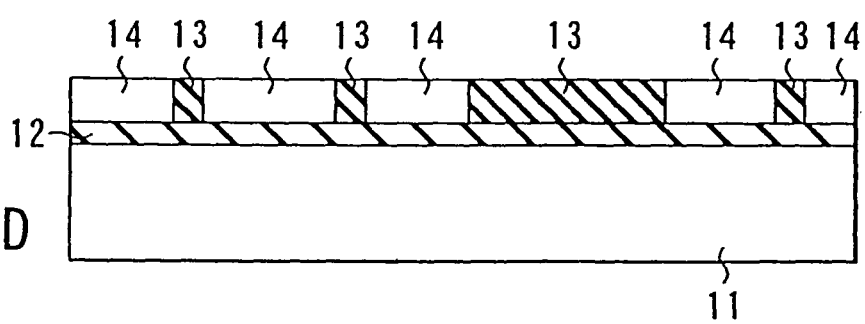

Next, as shown in FIG. 3D, CMP or mechanical polishing (MP) is used to remove unwanted portions of the epitaxial layer 14 outside the openings in the oxide film 13 to flatten a surface of the epitaxial layer 14.

Figure 3E:
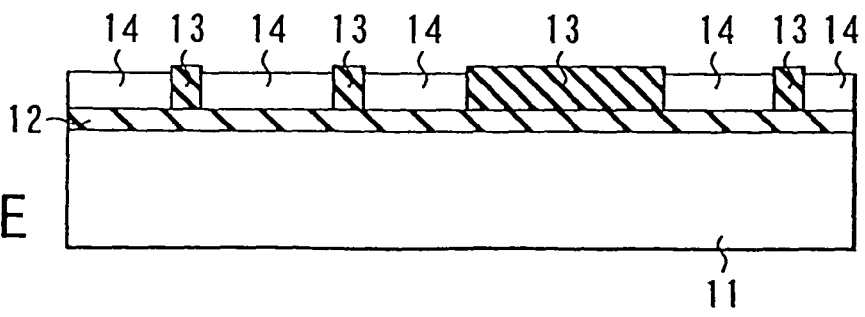

Next, as shown in FIG. 3E, the surface of the epitaxial layer 14 remaining in the element forming regions is etched about 10 to 50 nm to remove a crystal damaged layer formed on the surface of the epitaxial layer 13 in the step in FIG. 3D. As a result, the surface of the epitaxial layer 14 is below a surface of the oxide film 13.

The above etching is wet etching using, for example, a liquid obtained by using acetic acid or pure water to dilute a liquid comprising nitric acid and 10% or less of hydrofluoric acid mixed together, if the epitaxial layer 14 comprises a silicon or silicon germanium.

In addition, with a germanium layer, this wet etching uses a liquid obtained by using acetic acid or pure water to dilute a liquid comprising nitric acid and 10% or less of hydrofluoric acid mixed together, or uses sulfuric acid (the etching rate is controlled as required by means of, for example, heating or dilution with water).

Finally, the substrate is subjected to thermal treatment in a hydrogen-containing atmosphere to flatten the surface of the epitaxial layer 14 at the level of an atomic layer, and distortion in an interface between the oxide film 13 and the epitaxial layer 14 is diminished to reduce interface level density down to $5 \times 10^{10}$ cm$^{-2}$ or less, thereby completing an element isolating structure. Subsequently, a desired semiconductor element, for example, a MOS transistor is formed on the epitaxial layer 3, as in the prior art.

In the step in FIG. 3C, a silicon film or the like may be formed all over the epitaxial layer 13 as in the second embodiment, in order to eliminate the pattern dependency of the thickness of the epitaxial layer 13.

Like the first embodiment, the third embodiment can prevent formation of voids and facets, which may cause variations, thereby providing an element isolating structure that can effectively restrain variations in element characteristics despite a further reduction in element size. Furthermore, this embodiment enables the element to be isolated in the SOI substrate more easily than in the prior art.

Fourth Embodiment

Figure 4A:
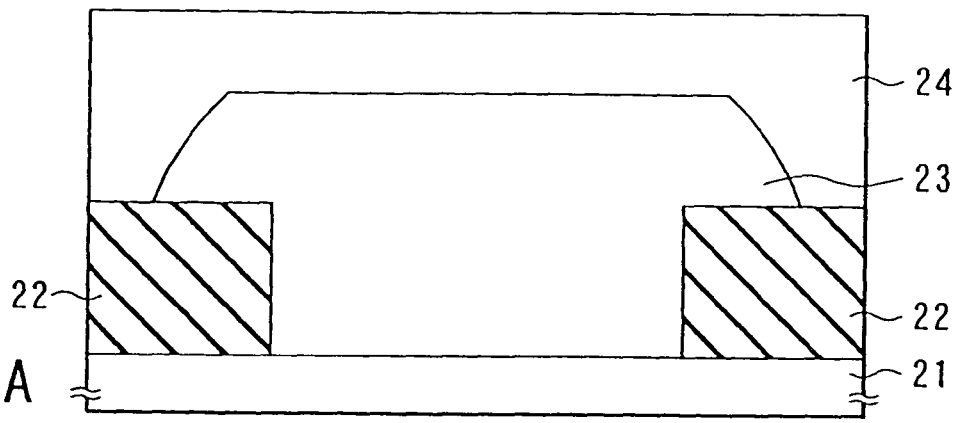
FIGS. 4A, 4B, 4C, 4D, 4E, 4F, 4G, 4H, 4I, 4J and 4K are process sectional views showing a method for manufacturing a MOS transistor according to a fourth embodiment of the present invention.

FIGS. 4A to 4K are process sectional views showing a method for manufacturing a MOS transistor according to a fourth embodiment of the present invention. First, as shown in FIG. 4A, a thermal oxide film 22 of thickness between about 200 and 300 nm is formed on a monocrystalline silicon substrate 21 by means of thermal oxidation. After the thermal oxidation, NO, $N_2O$, $NH_3$, or nitrogen radicals may be used to replace a SiN film for a region of the thermal oxide film 22 at least about 10 to 20 nm deep from its surface.

Next, as shown in FIG. 4A, photolithography and anisotropic etching are used to selectively remove those portions of the thermal oxide film 22 that correspond to element forming regions, and an epitaxial layer 23 is then grown so as to be thicker than the thermal oxide film 22 and to extend upward above the film 22. Next, as in the second embodiment, a silicon film 24 is formed all over the epitaxial layer 23 to eliminate the pattern dependency of the thickness of the epitaxial layer 23.

The epitaxial layer 23 is a silicon layer, a silicon germanium layer, or a germanium layer. The silicon film 24 may be replaced with a silicon germanium film or a germanium film.

Figure 4B:
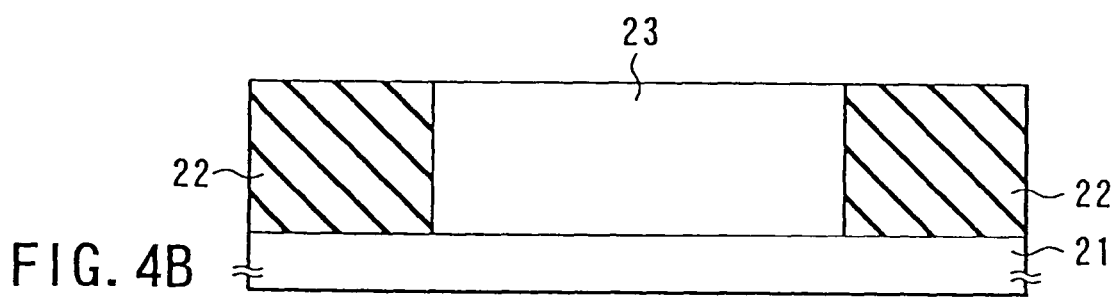

Next, as shown in FIG. 4B, CMP or MP is used to remove portions of the silicon film 24 and epitaxial layer 23 outside the openings in the thermal oxide film 22 to flatten the surface of the epitaxial layer.

Subsequently, to improve the crystallinity of a surface of the epitaxial layer 23, the surface is subjected to thermal treatment in a hydrogen atmosphere at 800° C. or higher and preferably 900° C. or higher. Such thermal treatment moves Si atoms on the surface of the epitaxial layer 23 to flatten the surface at an atomic level, thereby improving crystallinity.

The above described method can form element regions (the epitaxial layer 23) and element forming regions (the thermal oxide film 22) separated at intervals of 0.15 μm or less (in the prior art, this interval is limited to about 0.18 μm).

Figure 4C:
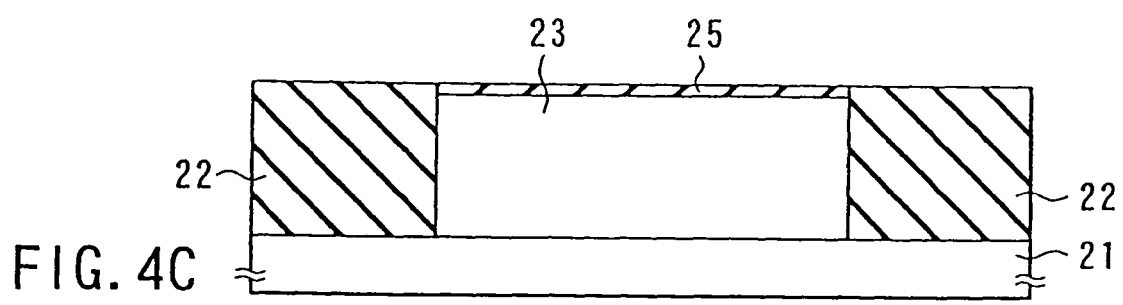

Subsequently, a process for manufacturing a MOS transistor is carried out. First, as shown in FIG. 4C, a thermal oxide film 25 is formed on the epitaxial layer 23 so as to have a thickness between about 3 and 10 nm.

Figure 4D:
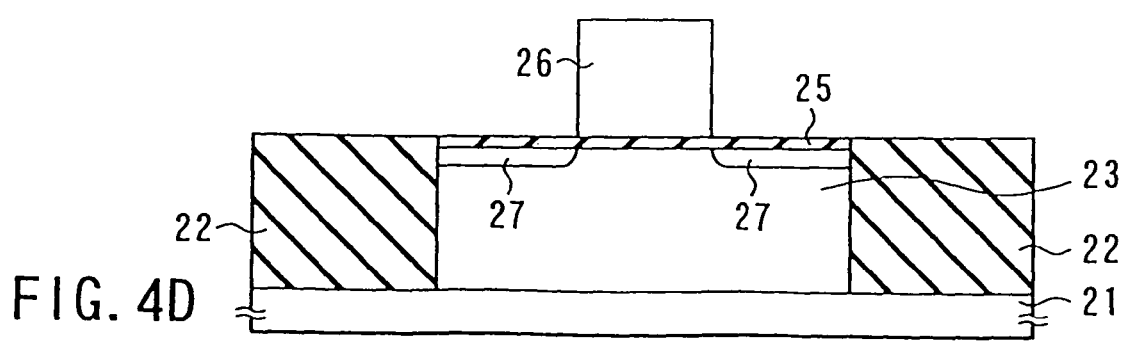

Next, as shown in FIG. 4D, a dummy gate film 26 having the same pattern as a gate electrode is formed on the thermal oxide film 25. The dummy gate film 26 is a laminated film (a SiN/a-Si film) including a silicon nitride film and an amorphous silicon film. This film is processed by means of anisotropic etching to form the dummy gate film 26.

The film in the upper layer of the dummy gate film 26 is not limited to the silicon nitride film but may be a film that is polished slower than an interlayer insulating film 30 in a subsequent flattening step (FIG. 4F) of polishing the interlayer insulating film 30.

The film in the lower layer of the dummy gate film 26 is not limited to the amorphous silicon film but may be a film that is etched slower than the thermal oxide film 25. Specifically, it may be a Si-based film such as a polycrystalline silicon film.

Next, as shown in FIG. 4D, the thermal oxide film 25 and the dummy gate film 26 are used as masks to introduce impurities into the substrate surface by means of the ion introduction process such as ion implantation, plasma doping, or gas phase diffusion in order to form an extension region (LDD) 27 of a source/drain region.

These impurities are activated by means of thermal treatment between 800 and 1,000° C. for 30 seconds or shorter using RTA (Rapid Thermal Annealing) that can increase temperature at 100° C./sec. or more.

Figure 4E:
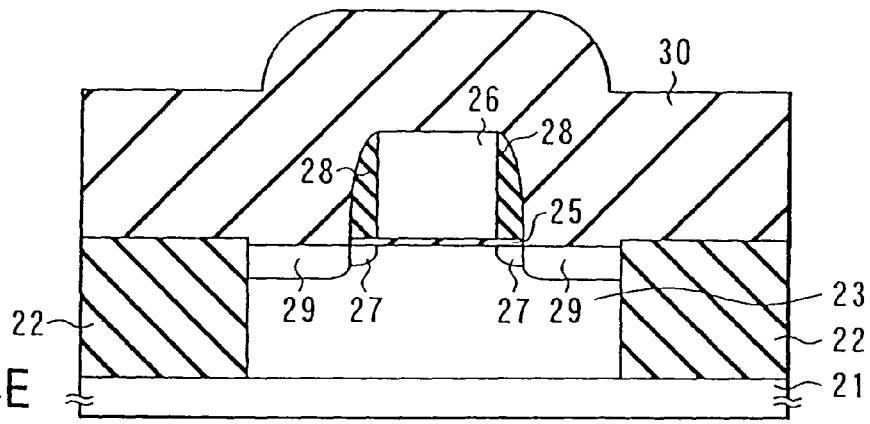

Next, as shown in FIG. 4E, what is called "side wall leaving" is used to form a gate side wall insulating film 28 comprising a silicon nitride film or silicon nitride oxide film having a thickness between about 5 and 30 nm. An oxide film of thickness 10 nm or less is desirably interposed between the gate side wall insulating film 28 and the dummy gate film 26 so that the gate side wall insulating film 28 will not recede in a subsequent step of removing the dummy gate film 26.

Next, as shown in FIG. 4E, impurities are introduced into the substrate surface by means of the ion introduction process such as ion implantation, plasma doping, or gas phase diffusion, to form a deep region 29 in the source/drain region. These impurities are activated by means of thermal treatment between 800 and 900° C. for 30 seconds or shorter using RTA that can increase temperature at 100° C./sec. or more.

To increase the concentration of the activated impurities, electron beams or a laser, a mercury lamp, or a xenon lamp having wavelengths in an ultraviolet region may be used to provide thermal treatment at 1,000° C. or higher for one second or shorter. The electric activation of the impurities in the step in FIG. 4D can be executed in this step.

Subsequently, as shown in FIG. 4E, the interlayer insulating film 30 thicker than the dummy gate film 26 is deposited all over the substrate surface using the CVD process. The interlayer insulating film 30 is a $SiO_2$ film that can be etched sufficiently faster than the silicon nitride film in the upper part of the dummy gate film 26.

Figure 4F:
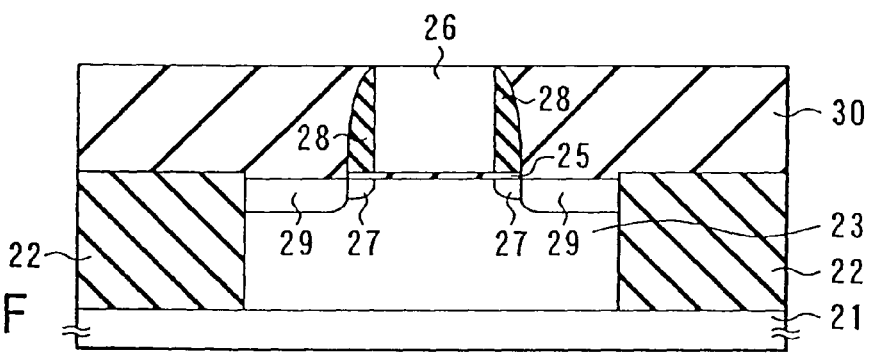

Next, as shown in FIG. 4F, the interlayer insulating film 30 is polished by means of CMP until a surface of the dummy gate film 26 is exposed, thereby flattening the surface of the interlayer insulating film.

Figure 4G:
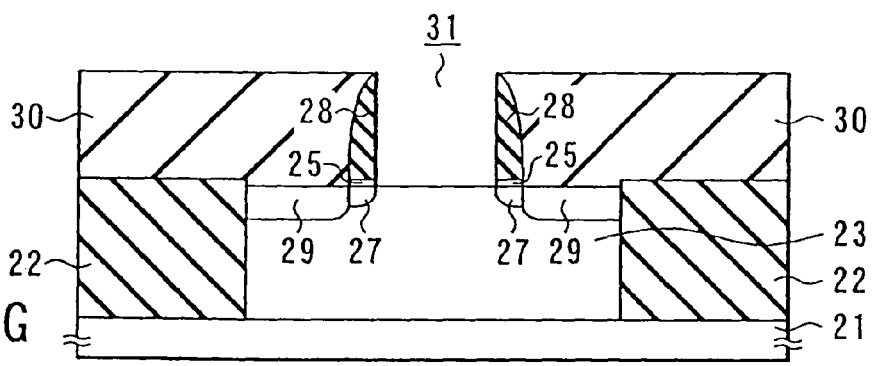

Next, as shown in FIG. 4G, the dummy gate film 26 is removed using etching comprising a combination of isotropic and anisotropic etching, and the thermal oxide film 25 is etched off while avoiding forming crystal defects in the epitaxial layer 23, to form an opening 31.

Figure 4H:
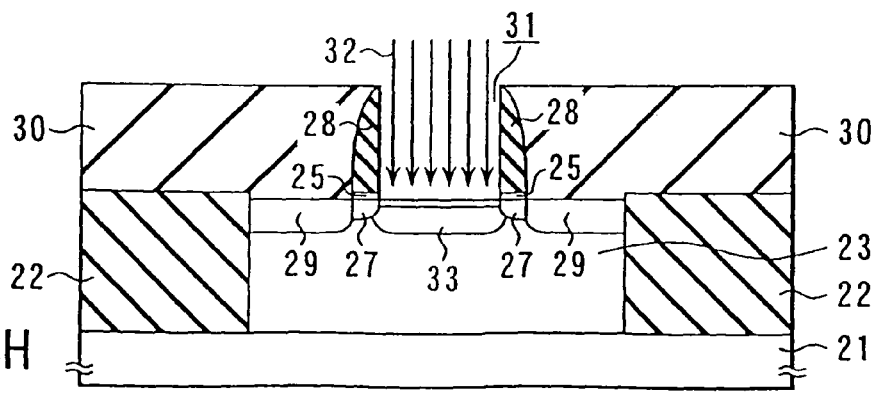

Next, as shown in FIG. 4H, B, Ga, In, P, As, or Sb ions 32 are injected into a bottom surface of the opening 31 to form a channel impurity doping layer 33.

The ions are preferably injected at low temperature. Specifically, the ions are injected while cooling the silicon substrate 21 so that its temperature is maintained at −60° C. or lower and desirably −100° C. or lower.

The ion implantation at such low temperature can avoid concentrating atomic holes to allow crystal defects to be completely corrected through thermal treatment.

Figure 4I:
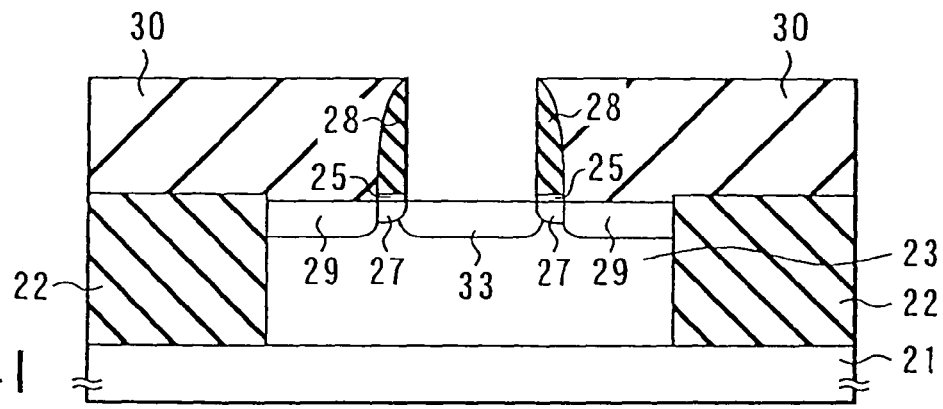

The thermal treatment for activation of the impurities is desirably started by producing a vacuum in a thermal treatment room or allowing a sufficient amount of inert gas such as N or Ar to flow through the thermal treatment room so that an oxidizing agent such as oxygen, water vapor, or carbon dioxide will not enter the room. FIG. 4I shows a sectional view after the thermal treatment.

Subsequently, wet treatment using an aqueous solution containing water with hydrogen peroxide or ozone, or dry treatment using oxygen radicals or ozone is used to form an oxide film (not shown) of thickness 1 nm or less on portions of the surface of the epitaxial layer 23 corresponding to the bottom surface of the opening 31.

Figure 4J:
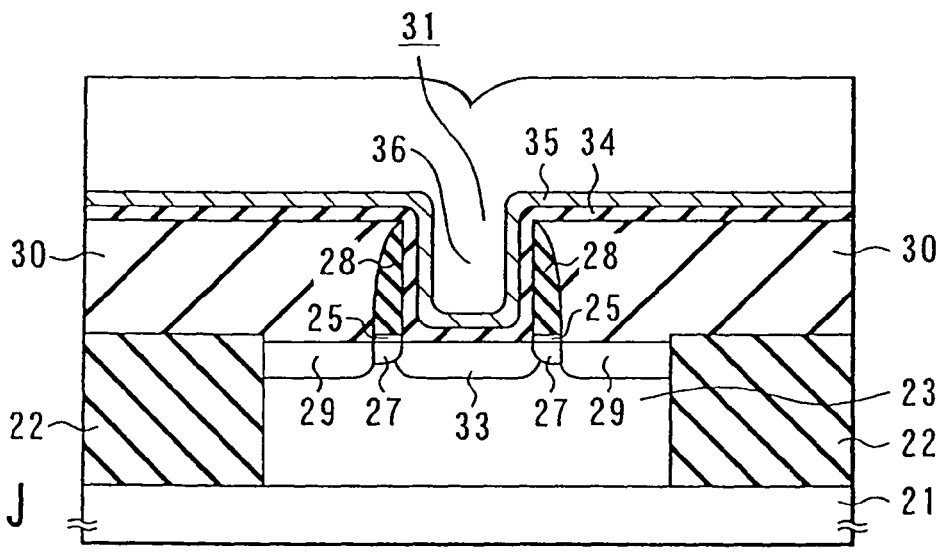

Next, as shown in FIG. 4J, a gate insulating film 34 of thickness between about 1 and 20 nm is formed to cover surfaces of the opening 31 (its bottom and side surfaces), the gate insulating film 34 comprising an insulating material such as $Ta_2O_5$, $TiO_2$, BSTO, or $CeO_2$ which has a larger dielectric constant than $SiO_2$.

When the gate insulating film 34 has a thickness larger than 20 nm, the volume of the opening 31 occupied by the gate insulating film 34 becomes excessively large to increase gate resistance or hindering carriers in a channel section from being controlled by a gate voltage, that is, hindering the threshold voltage from being controlled.

If the gate insulating film 34 is formed by means of the CVD process, the following procedure is preferably executed before forming the gate insulating film 34, in order to prevent non-uniform growth: A surface oxide film such as a native oxide film or a chemical oxide film is removed, and the resulting surface is allowed to adsorb oxygen to form one or two atomic layers or a Si—O bonded layer is formed.

The above high-dielectric-constant insulating film comprising $Ta_2O_5$, $TiO_2$, or the like may also be formed on a $SiO_xN_y$ layer of thickness 1 nm or less.

Next, as shown in FIG. 4J, a thin conductive film having a metal conductivity that determines a work function for a gate, for example, a TiN film 35 of thickness 10 nm or less is formed on the gate-insulating film.

In this case, film formation conditions such as TiN composition, deposition temperature, and pressure are determined so that the TiN film 35 has a crystal particle size of 30 nm or less. In this embodiment, while controlling the partial pressure ratio between Ar and N to set the ratio between Ti and N so that the amount of N is excessive compared to the ratio of 1:1 at 300° C. or lower, a TiN film is formed by means of sputtering, and 30% or less of oxygen is then added to this TiN film to form the TiN film 35.

By adding 1 to 10% of oxygen, the TiN film can have a crystal particle size of 10 nm or less. Above this oxygen concentration, the electric conductivity decreases and fails to exhibit a metal conductivity, so that the concentration must be smaller than 10%.

Instead of oxygen, B (boron) or C (carbon) may be added to reduce the crystal particle size of the TiN film below that of a TiN film with no addition. Addition of 10 to 30% of B or C makes this film amorphous.

B or C may be added by using a compound gas containing B or C, for example, boron or carbon hydride, or B or C fluoride for TiN sputtering, or chemically sputtering a Ti sputtering target containing B or C in a mixed gas of Ar and N or using Ar to sputter a TiN target containing B or C. By adding impurities such as O, B, or C to the TiN to control the composition of the TiN, the work function can be set at 4.5 ev or less.

A CVD process with $TiCl_4$ and $NH_3$ may also be used to form a film while setting the ratio between Ti and N so that the amount of N is excessive compared to the ratio of 1:1 at 600° C. or lower. Above 600° C., recess and projections on a surface of the TiN film are significantly enlarged to preclude a low-resistance metal film from being formed thereon.

Similarly to the TiN film formed by means of sputtering, the method for adding 30% or less of oxygen may be used to obtain fine crystals. The concentration of added oxygen is desirably between 1 and 10% and such an amount of oxygen serves to set the crystal particle size at 30 nm or less. A thickness of 10 nm or less enables the crystal particle size to be controlled to 10 nm or less.

A TiN or TiCN film may be formed by thermally decomposing dimethylaminotitanium $(Ti\{N(CH_3)_2\}_4)$ or dimethylaminotitanium $(Yi\{N(CH_3)_2\}_4)$ in a hydrogen-containing atmosphere or using plasma.

If a gate electrode is allowed to have a specific resistance of 50 μΩ·cm or more, all of the gate electrode may be formed of the TiN film. In this case, since the TiN film must be formed to be 50 nm or more in thickness, it must comprise columnar or needle-shaped crystals and be orientated or must be amorphous.

In addition to TiN, electrode materials include, for example, metal nitrides such as Ta nitrides, Nb nitrides, Zr nitrides, or Hf nitrides, or metal carbides, metal borides, metal-Si nitrides, metal-Si carbides, or metal carbon nitrides.

Desirably, to provide thermal stability for the gate insulating film 34 and the thin conductive film comprising the above electrode material to determine the work function for the gate, oxygen is effectively added so that the conductivity will not decrease by 50% or more. These electrode materials are thermally stable in an interface with a Ta oxide, a Ti oxide, an Xr oxide, an Hf oxide, or a Ce oxide.

Figure 4K:
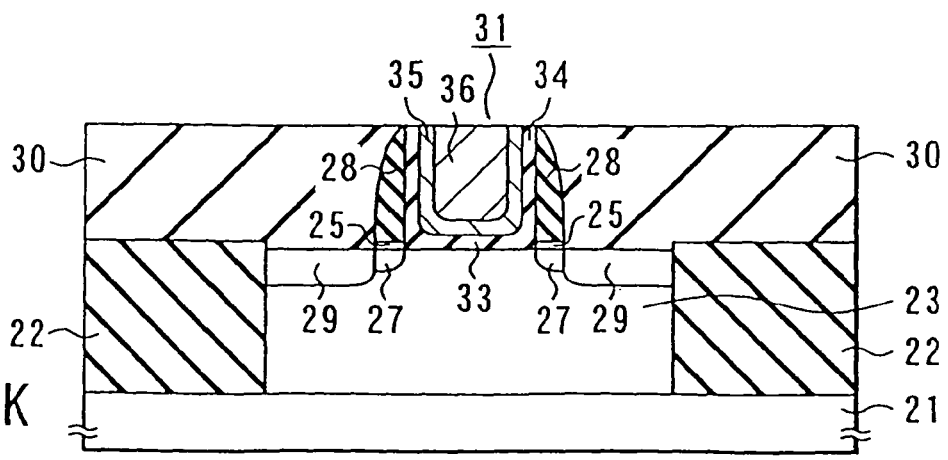

Finally, as shown in FIG. 4K, a gate electrode 36 is embedded in the opening 36 to complete a MOS transistor. One method for forming the gate electrode 36 forms an Al film all over the surface of the structure by means of sputtering, fills the inside of the opening 31 with the Al film by means of reflow, and using CMP or MP to remove unwanted portions of the Al film, gate insulating film 34, and TiN film 35. Another method uses the CVD process to deposit a metal film such as a W film which has a low specific resistance, all over the surface of the structure to fill the inside of the opening 31, and then uses CMP or MP to remove unwanted portions of the metal film, gate insulating film 34, and TiN film 35 outside the opening 31.

If the source/drain region must have a low specific resistance, a step may be added between the step in FIG. 4D and the step in FIG. 4E to form a metal silicide layer such as a $CoSi_2$ or $TiSi_2$ layer on a surface of the source/drain region.

If the source/drain region 29 has a depth of 100 nm or less, a silicon layer, a silicon germanium layer, or a silicon germanium carbon layer is preferably epitaxially grown on the source/drain region 29 so that the epitaxial layer 23, which is eroded by the metal silicide layer, is separated from an interface (a pn junction interface) between the source/drain region 29 and the epitaxial layer 23 by 5 nm or more.

Although in this embodiment, the method for manufacturing a Damacine gate type MOS transistor has been described, a normal MOS transistor may be manufactured by forming a gate electrode comprising a typical n- or p-type polysilicon film, a laminated film of a silicide film/a metal film, or a laminated film of a silicide film/an n- or p-type polysilicon film or a gate electrode comprising a metal film (a metal gate electrode), instead of the dummy gate film 26 in the step in FIG. 4D. A nitride film that is etched slower than the oxide film may be laminated on the gate electrode.

The present invention is particularly effective in employing the metal gate electrode. That is, the present invention can easily reduce the threshold voltage in contrast to the prior art. This is due to an improved current driving capability even with the same channel length as described in detail in a twelfth embodiment.

Figure 5:
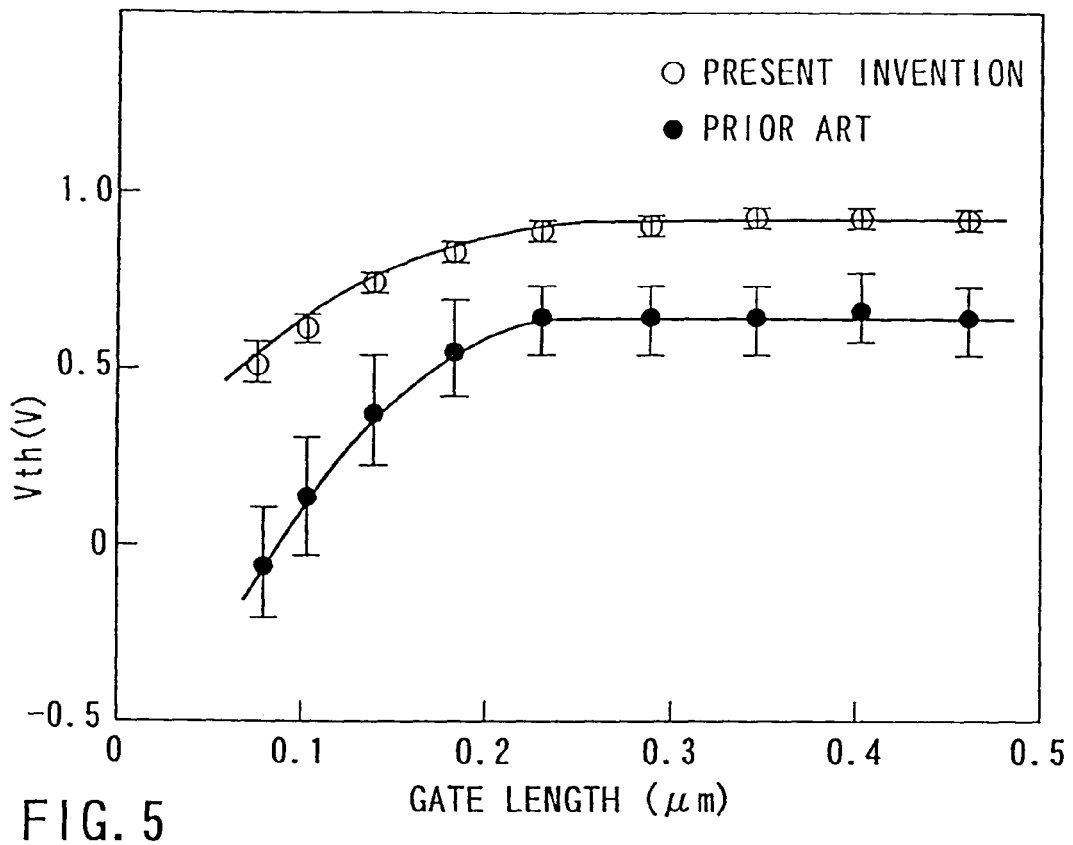
FIG. 5 is a diagram showing the dependency on gate length of the threshold voltage $V_{th}$ of MOS transistors formed according to the present method and a conventional method.

FIG. 5 shows the dependency on gate length of the threshold voltage $V_{th}$ of MOS transistors formed according to the present method and a conventional method. The MOS transistor formed according to the present method prevents the element isolating insulating film from receding in the boundaries between the element isolating regions and the element regions due to facets or the like. In addition, the Si surfaces of the element regions are 15 nm lower than the surface of the element isolating insulating film. The MOS transistor formed according to the conventional method has the element isolating insulating film recede in the boundaries between the element isolating regions and the element regions due to facets or the like.

The figure shows that the MOS transistor formed according to the present invention has small variations in its threshold voltage $V_{th}$ which are equal to 30 mV or lower, whereas the MOS transistor formed according to the conventional method has large variations in its threshold voltage $V_{th}$ which are equal to 50 to 100 mV. The conventional method has the large variations in its threshold voltage $V_{th}$ because the element isolating insulating film may recede and because the amount of this recession varies.

Fifth Embodiment

FIGS. 6A to 6F are process sectional views showing a method for forming an element isolating structure according to a fifth embodiment of the present invention.

Figure 6A:
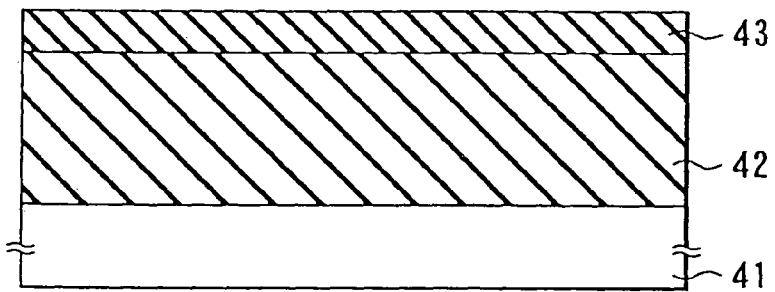
FIGS. 6A, 6B, 6C, 6D, 6E and 6F are process sectional views showing a method for forming an element isolating structure according to a fifth embodiment of the present invention.

First, as shown in FIG. 6A, thermal oxidation is used to form an oxide film 42 of thickness about 200 nm on a surface of a monocrystal silicon substrate 41, and the CVD process is used to form a silicon nitride film 43 of thickness about 50 nm on the oxide film 42. The silicon substrate 41 has a p conductivity type and a face orientation (100).

Although this embodiments sets the thickness of the oxide film 42 at 200 nm, it may be 400 nm and in this case, the silicon substrate is oxidized at, for example, 1,000° C. Additionally, although this embodiment sets the thickness of the silicon nitride film 43 at 50 nm, it may be 15 nm and in this case, the film is formed by means of, for example, a reduced-pressure CVD process using $SiCl_2H_2$ and $NH_3$.

Figure 6B:
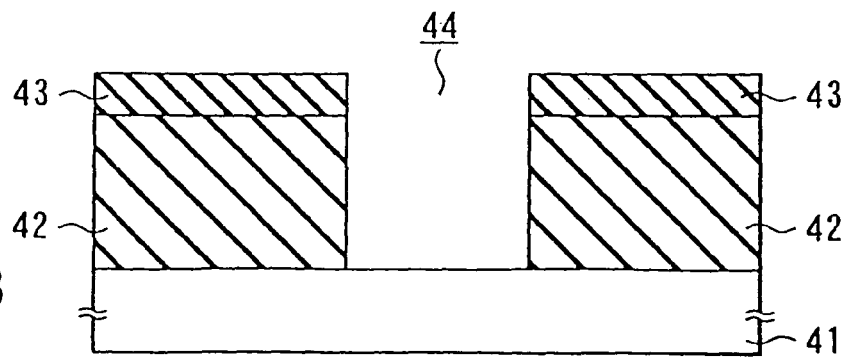

Next, as shown in FIG. 6B, photolithography and RIE are used to process the silicon nitride film 43 and the oxide film 42 so as to form an opening 44 in a region corresponding to an element forming region in a manner such that the opening 44 reaches the silicon substrate 41. The silicon nitride film 43 is etched using a photo resist as a mask, and after the photo resist has been released, the oxide film 42 is etched using as a mask the silicon nitride film with a photo resist pattern transferred thereto. Both the silicon nitride film 43 and the oxide film 42 may be etched using a photo resist as a mask.

Next, as a preprocess for the epitaxial growth, a CDE (Chemical Dry Etching) process using a mixed gas of $CF_4$ and oxygen is carried out to etch the substrate surface about 10 nm to remove a damaged layer formed thereon due to the RIE, and a native oxide film on the substrate surface is then removed by means of wet treatment using diluted hydrofluoric acid. The CDE can be replaced with RIE using $O_2$.

Figure 6C:
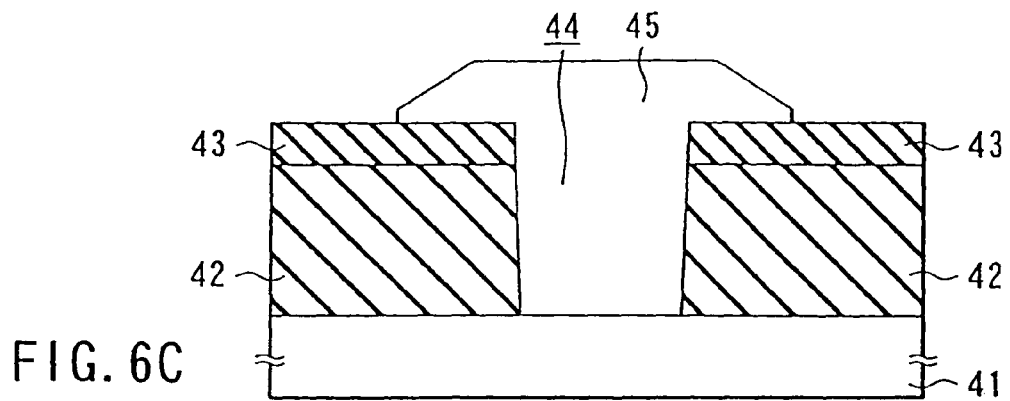

Next, as shown in FIG. 6C, the exposed portion of the substrate surface is used as a seed to selectively grow an epitaxial layer 45. The epitaxial layer 45 is selectively grown so as to fill the opening 44 and to extend upward above the silicon nitride film 43. The epitaxial layer 45 is a silicon layer, a silicon germanium layer, or a germanium layer, as in the first embodiment. With the silicon layer, for example, a mixed gas of $SiH_4$ and $H_2$, a mixed gas of $SiH_2Cl_2$ and $H_2$, or either of these mixed gases with HCl addition.

Figure 6D:
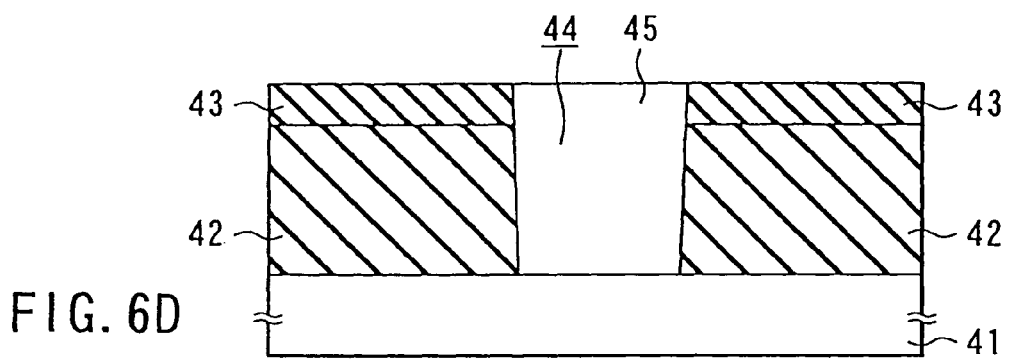

Next, as shown in FIG. 6D, unwanted portions of the epitaxial layer 45 outside the opening 44 are removed by means of CMP conditioned to polish SiN sufficiently more slowly than Si, thereby flattening a surface of the epitaxial layer 45. A grindstone for use in this step is, for example, ceria.

Figure 6E:
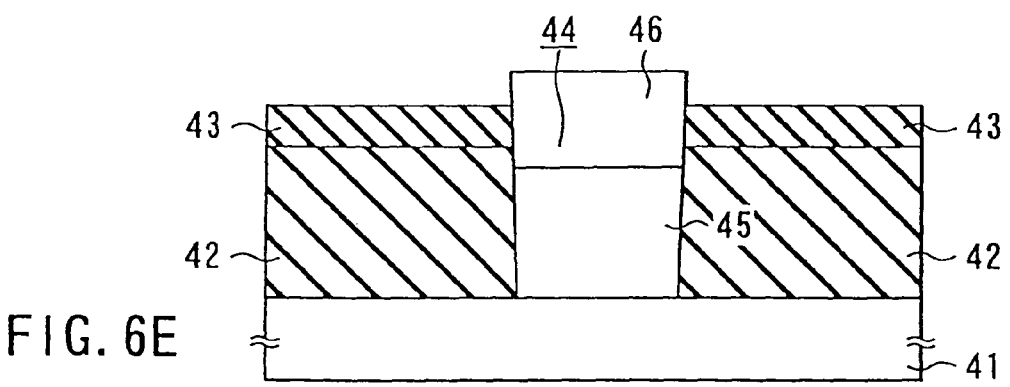

Next, as shown in FIG. 6E, thermal oxidation is used to form an oxide layer 46 of thickness about 150 nm. At this point, the position of the interface between the oxide layer 46 and the epitaxial layer 45 is about 75 nm lower than that of the surface of the silicon nitride film 43.

Figure 6F:
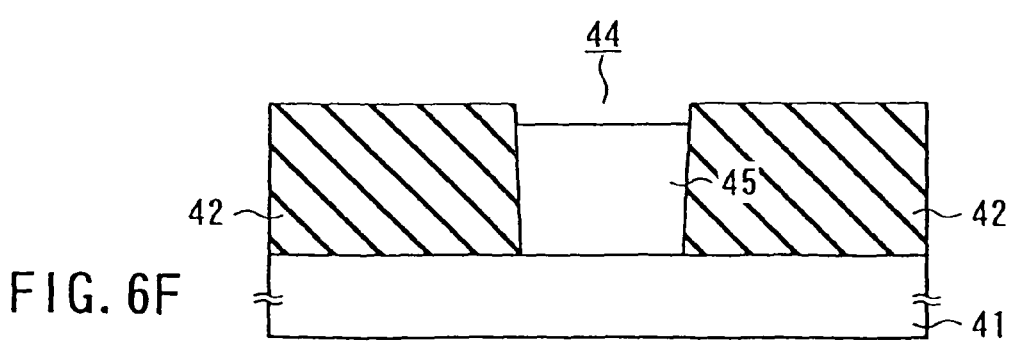

Next, as shown in FIG. 6F, the oxide layer 46 is removed by means of RIE, and the silicon nitride film 43 is then selectively removed by means of wet etching using a phosphoric liquid. As a result, the position of the surface of the epitaxial layer 45 in the element forming region is 25 nm lower than that of the surface of the oxide film 42 in the element isolating region. Although this embodiment removes the oxide layer 46 by means of RIE, wet etching using a BHF or DHF solution may be carried out. This is followed by a step of forming a desired semiconductor element in the epitaxial layer 45, as in the prior art.

Sixth Embodiment

Figure 7A:
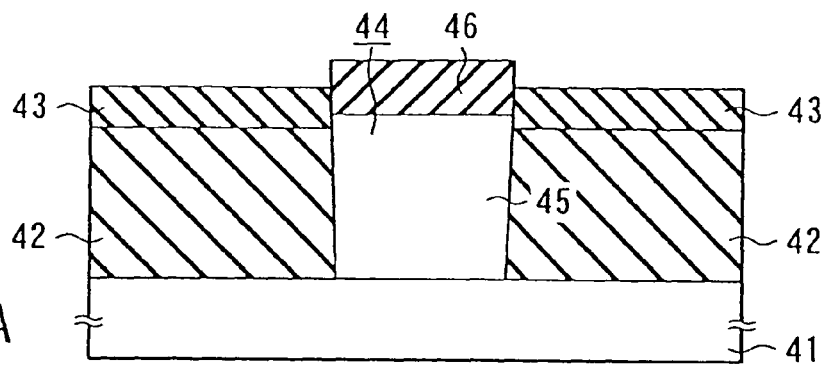
FIGS. 7A and 7B are process sectional views showing a method for forming an element isolating structure according to a sixth embodiment of the present invention.
Figure 7B:
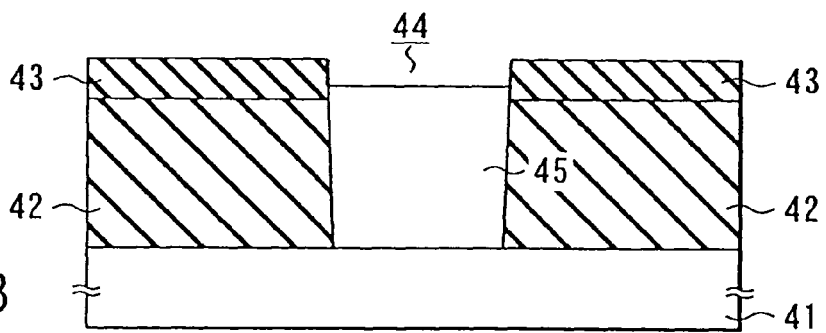

FIGS. 7A to 7B are process sectional views showing a method for forming an element isolating structure according to a sixth embodiment of the present invention. Those parts that correspond to FIGS. 6A to 6F are denoted by the same reference numerals as those in these figures, and their detailed description is omitted.

First, the steps shown in FIGS. 6A to 6D for the fifth embodiment are carried out.

Next, as shown in FIG. 7A, thermal oxidation is used to form an oxide layer 46 of thickness about 50 nm. At this point, the position of the interface between the oxide layer 42 and the silicon nitride layer 43 is about 25 nm lower than that of the interface between the oxide layer 46 and the epitaxial layer 45. If the silicon nitride film 43 is 15 nm in thickness, thermal oxidation is carried out, for example, at 90° C. so that the oxide film 42 has a thickness of about 10 nm.

Finally, as shown in FIG. 7B, the oxide layer 46 is selectively removed by means of RIE to complete the element isolating structure. Subsequently, thermal treatment may be provided to flatten the surface of the structure, as in the first embodiment. The position of the surface of the epitaxial layer 45 in the element forming region is 25 nm lower than that of the surface of the silicon nitride film 43 in the element isolating region. If thermal oxidation is executed so that the oxide film 42 has a thickness of about 10 nm, the position of the surface of the epitaxial layer 45 in the element forming region is about 10 nm lower than that of the surface of the silicon nitride film 43 in the element isolating region.

Seventh Embodiment

Figure 8A:
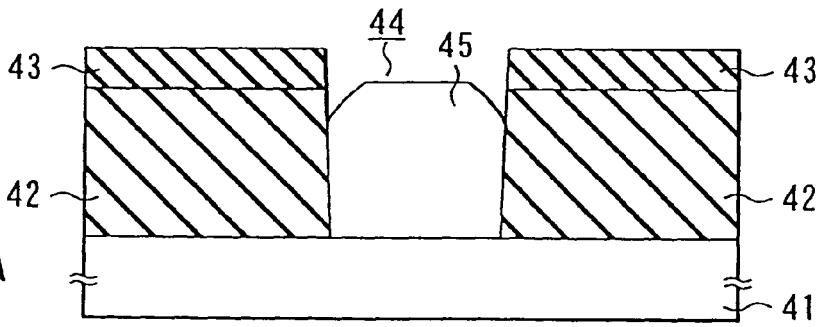
FIGS. 8A, 8B and 8C are process sectional views showing a method for forming an element isolating structure according to a seventh embodiment of the present invention.
Figure 8B:
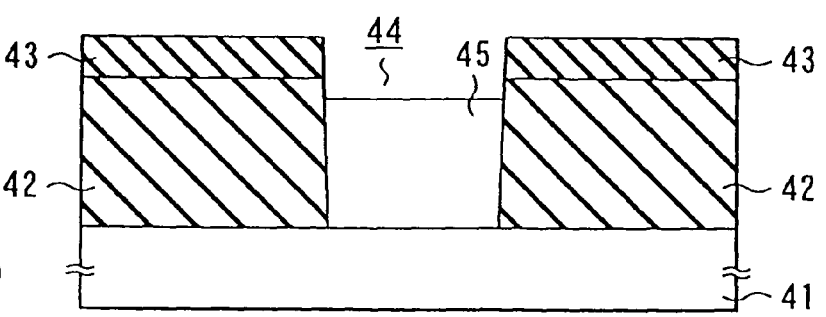
Figure 8C:
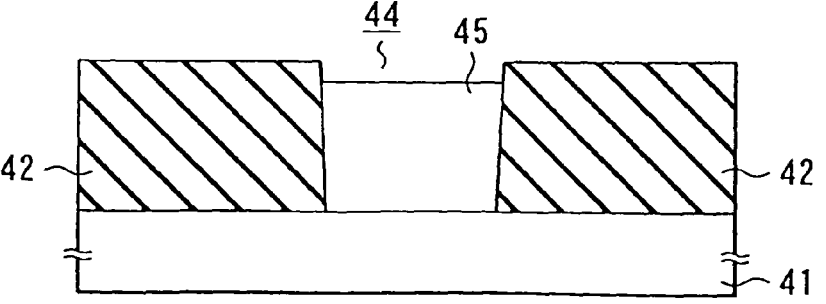

FIGS. 8A to 8C are process sectional views showing a method for forming an element isolating structure according to a seventh embodiment of the present invention. Those parts that correspond to FIGS. 6A to 6F are denoted by the same reference numerals as those in these figures, and their detailed description is omitted.

First, the steps shown in FIGS. 6A to 6B for the fifth embodiment (including removal of a damaged layer arising from RIE and removal of a native oxide film) are carried out.

Next, as shown in FIG. 8A, the exposed portion of the substrate surface is used as a seed to selectively grow the epitaxial layer 45 so as not to extend upward above the silicon nitride film 43. Consequently, facets may be created inside the opening 44. The epitaxial layer is also selectively grown so that the surface of the epitaxial layer 45 is slightly higher than the surface of the silicon oxide film 42.

Next, as shown in FIG. 8B, the structure is annealed at 1,000° C. for about 5 minutes in an $H_2$ atmosphere with a reduced pressure of about 10 Torr to fluidize the epitaxial layer 45 so as to flatten the surface of the epitaxial layer 45. As a result, the facets are eliminated. In addition, the position of the surface of the epitaxial layer 45 becomes lower than that of the surface of the silicon nitride film 42.

Finally, as shown in FIG. 8C, the silicon nitride film 43 is selectively removed by means of wet etching with phosphoric acid to complete the element isolating structure.

Eighth Embodiment

Figure 9A:
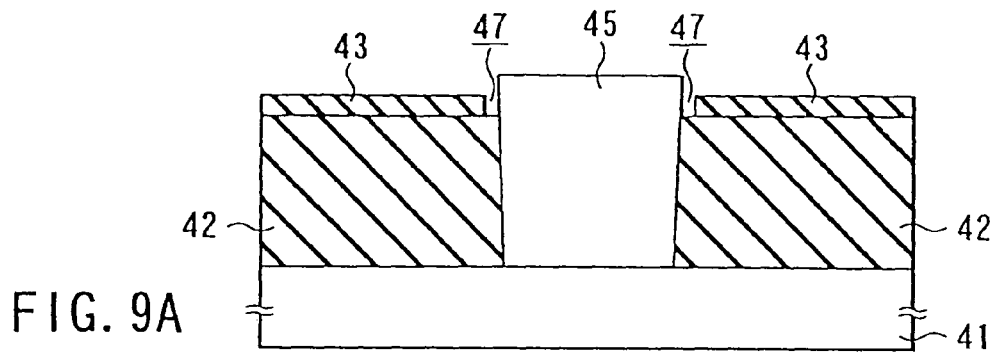
FIGS. 9A, 9B and 9C are process sectional views showing a method for forming an element isolating structure according to an eighth embodiment of the present invention.
Figure 9B:
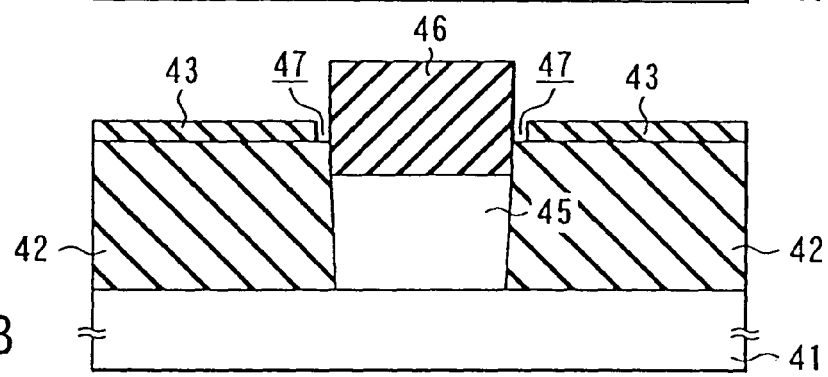
Figure 9C:
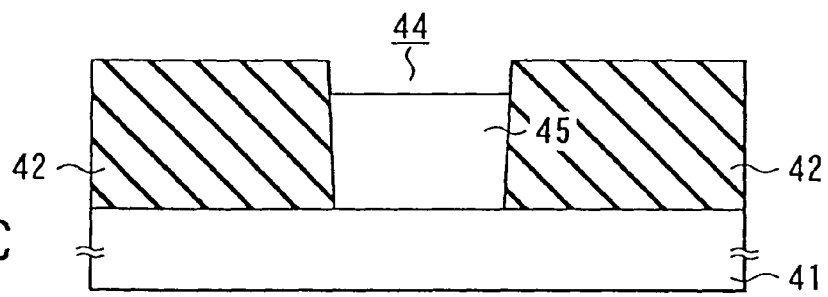

FIGS. 9A to 9C are process sectional views showing a method for forming an element isolating structure according to an eighth embodiment of the present invention. Those parts that correspond to FIGS. 6A to 6F are denoted by the same reference numerals as those in these figures, and their detailed description is omitted.

First, the steps shown in FIGS. 6A to 6B for the fifth embodiment are carried out.

Next, as shown in FIG. 9A, the silicon nitride film 43 is pulled back by means of etching based on thermal phosphoric treatment or hydrofluoric glycerol treatment, to remove portions of the silicon nitride film 43 around the epitaxial layer 45 to form an opening 47.

Next, as shown in FIG. 9B, the epitaxial layer 45 is thermally oxidized down to a depth of about 150 nm from its surface to form the oxide layer 46. As a result, the position of the interface between the oxide layer 46 and the epitaxial layer 45 is 75 nm lower than that of the surface of the silicon nitride film 42.

At this point, oxide species diffuse through the opening 47 into the interface between the oxide film 42 and the epitaxial layer 45 to thermally oxidize the interface, thereby allowing the element to be isolated appropriately. This thermal oxidation also serves to recover the crystallinity of the epitaxial layer 45, which has been degraded by the CMP.

Finally, as shown in FIG. 9C, the oxide layer 46 is selectively removed by means of RIE, and the silicon nitride film 43 is selectively removed by means of wet etching using phosphoric acid, to complete the element isolating structure. The position of the surface of the epitaxial layer 45 in the element forming region is 25 nm lower than that of the surface of the oxide film 42 in the element isolating region.

Ninth Embodiment

FIGS. 10A to 10G are process sectional views showing a method for forming an element isolating structure according to an eighth embodiment of the present invention. Those parts that correspond to FIGS. 6A to 6F are denoted by the same reference numerals as those in these figures, and their detailed description is omitted.

Figure 10A:
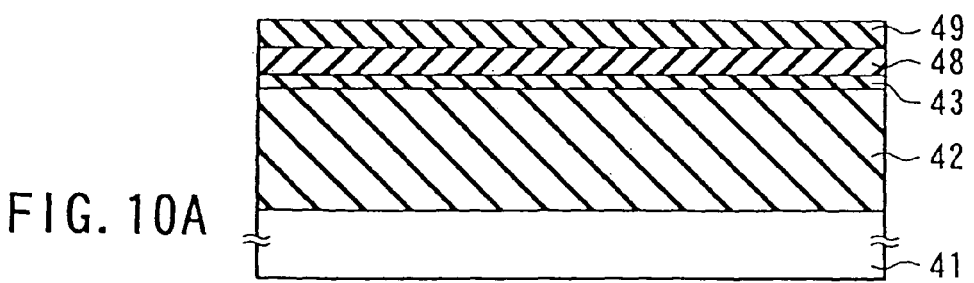
FIGS. 10A, 10B, 10C, 10D, 10E, 10F and 10G are process sectional views showing a method for forming an element isolating structure according to a ninth embodiment of the present invention.

First, as shown in FIG. 10A, the oxide film 42 of thickness about 200 nm and the silicon nitride film 43 of thickness about 10 nm are sequentially formed on the silicon substrate 41, as in the fifth embodiment. Next, as shown in FIG. 10A, an $SiO_2$ film 48 of thickness about 50 nm and a silicon nitride film 49 of thickness about 50 nm are sequentially formed on the silicon nitride film 43 by means of the CVD process.

Figure 10B:
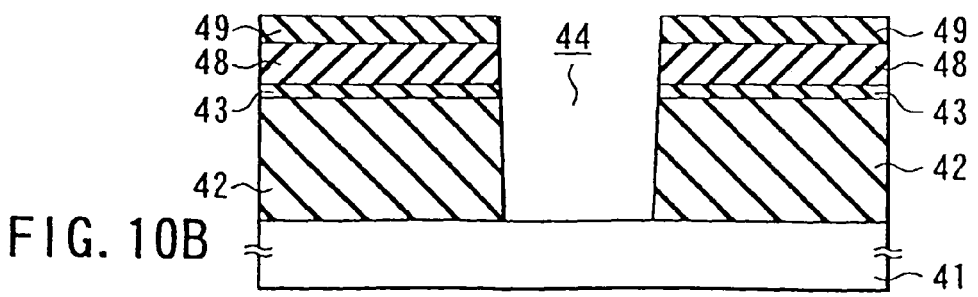

Next, as shown in FIG. 10B, photolithography and RIE are used to process the oxide film 42, the silicon nitride film 43, the $SiO_2$ film 48, and the silicon nitride film 49 so as to form the opening 44.

Next, as a preprocess for the epitaxial growth, $O_2$-RIE is used to remove a damaged layer formed thereon due to the RIE, and a native oxide film on the substrate surface is then removed by means of wet treatment using diluted hydrofluoric acid.

Figure 10C:
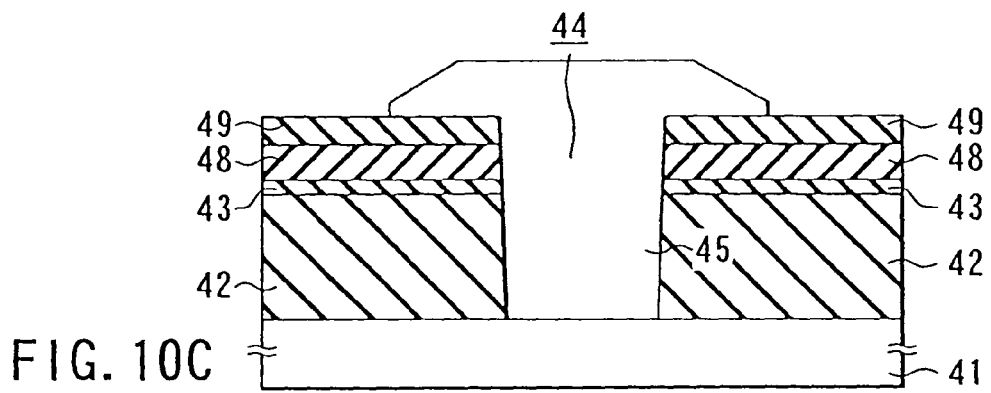

Next, as shown in FIG. 10C, the exposed portion of the substrate surface is used as a seed to selectively grow the epitaxial layer 45. The epitaxial layer 45 is selectively grown so as to fill the opening 44 and to extend upward above the silicon nitride film 49.

Figure 10D:
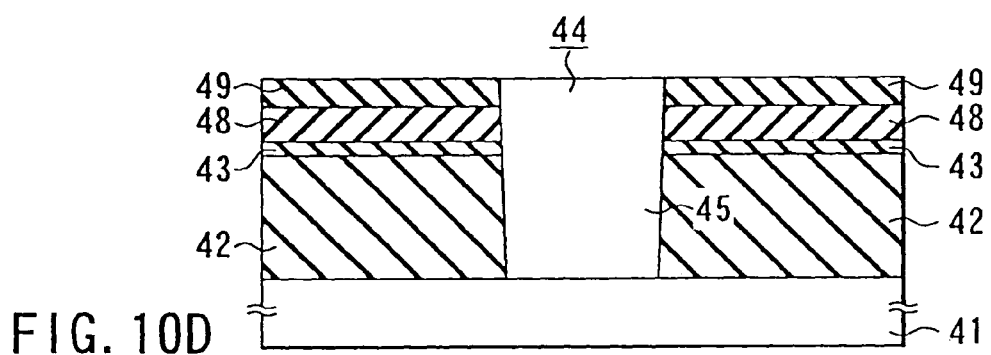

Next, as shown in FIG. 10D, unwanted portions of the epitaxial layer 45 outside the opening 44 are removed by means of CMP conditioned to polish SiN sufficiently more slowly than Si, thereby flattening a surface of the epitaxial layer 45.

Figure 10E:
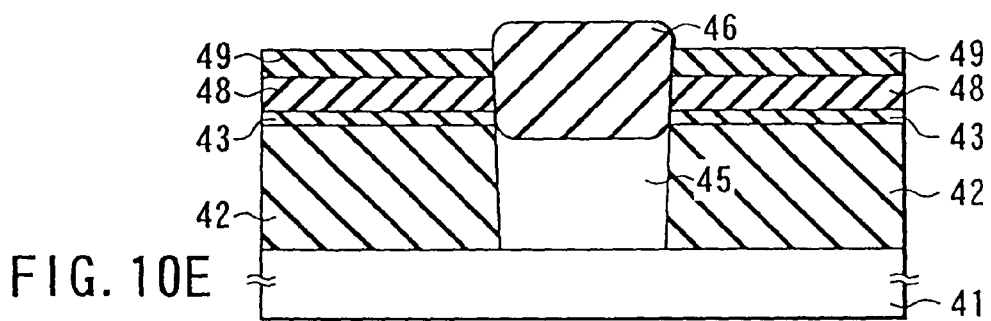

Next, as shown in FIG. 10E, the epitaxial layer 45 is thermally oxidized down to a depth of about 150 nm from its surface to form the oxide layer 46. This operation serves to recover the crystallinity of the epitaxial layer 45, which has been degraded by the CMP.

Figure 10F:
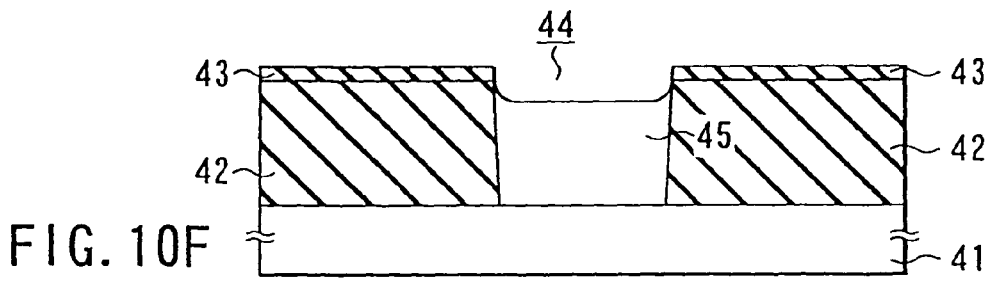

Next, as shown in FIG. 10F, the silicon nitride film 49 is removed by means of wet etching using phosphoric acid, and the oxide layer 46 and the $SiO_2$ film 48 are then removed by means of wet etching using hydrofluoric acid.

Subsequently, the epitaxial layer 43 is thermally oxidized again to modify the interface between the oxide film 42 and the epitaxial layer 45. This allows the element to be appropriately isolated. The interface can be modified in this manner because the silicon nitride film 43 has a small thickness of about 10 nm.

Figure 10G:
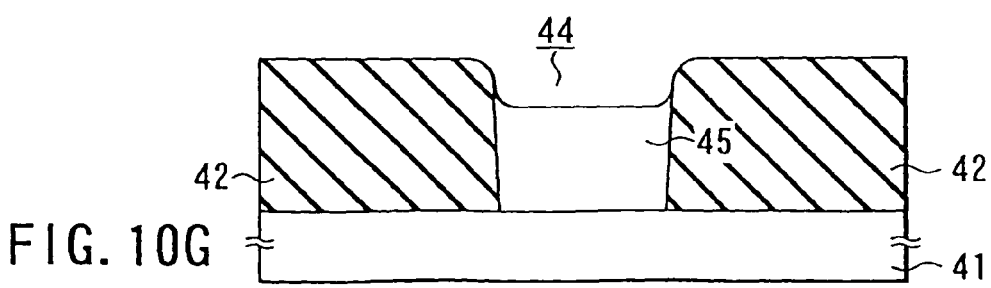

Finally, as shown in FIG. 10G, an $SiO_2$ (not shown) formed by the above reoxidation and the silicon nitride film 43 are sequentially removed by means of wet etching to complete the element isolating structure.

Tenth Embodiment

FIGS. 11A to 11D are process sectional views showing a method for forming an element isolating structure according to a tenth embodiment of the present invention.

First, the steps in FIGS. 6A to 6B for the fifth embodiment are carried out.

Figure 11A:
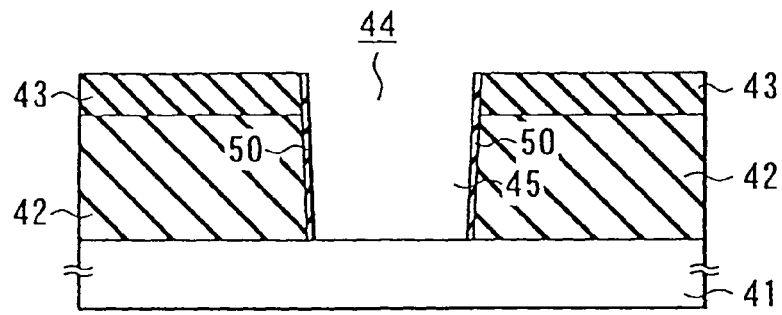
FIGS. 11A, 11B, 11C and 11D are process sectional views showing a method for forming an element isolating structure according to a tenth embodiment of the present invention.

Next, as shown in FIG. 11A, the CVD process is used to form a silicon nitride film of thickness 5 nm all over the surface of the structure, and RIE with a $CHF_3$ gas is carried out to etch back the silicon nitride film to form a silicon nitride film 50 on side walls of the opening 44.

Next, as a preprocess for the epitaxial growth, the CDE process using a mixed gas of $CF_4$ and oxygen is carried out to etch the substrate surface about 10 nm to remove a damaged layer formed thereon due to the RIE. Subsequently, a native oxide film on the substrate surface is removed by means of wet treatment using diluted hydrofluoric acid.

Figure 11B:
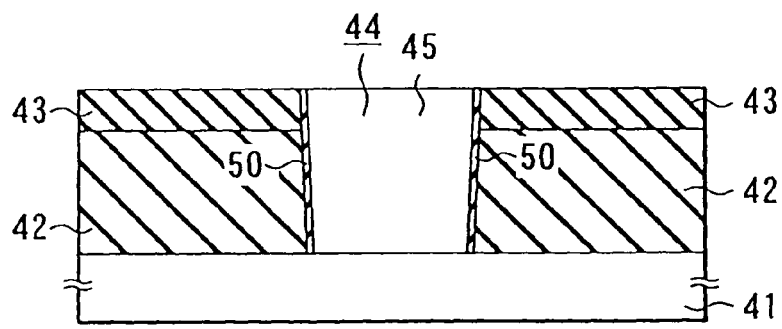
Figure 11C:
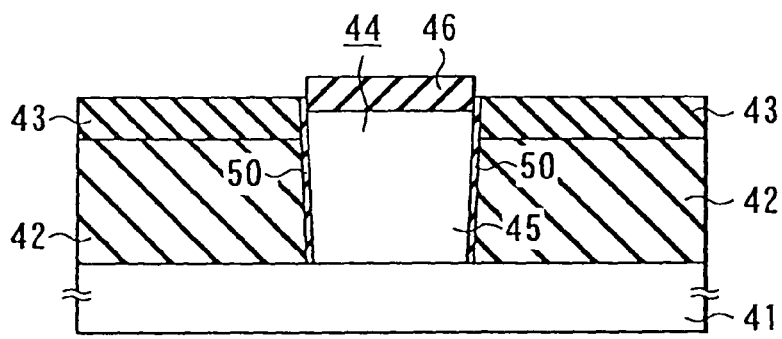
Figure 11D:
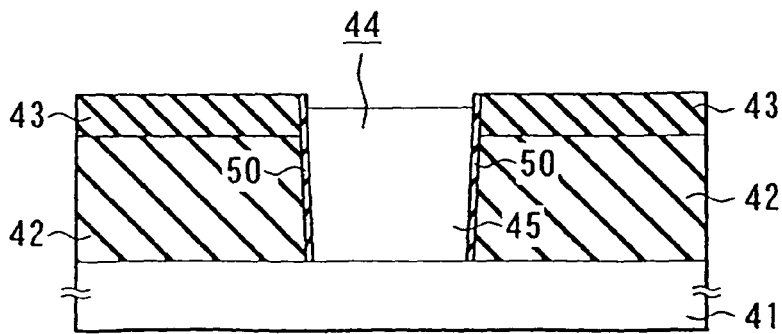

Next, as shown in FIG. 11B, the epitaxial layer 45 is embedded and formed in the opening 44. This step is the same as the step in FIG. 6C for the fifth embodiment (the selective growth of the epitaxial layer 45) minus the step in FIG. 6D therefor (the removal of the unwanted portions of the epitaxial layer 45 by means of CMP). Due to the silicon nitride film 50 formed on the side walls of the opening 44, no facet is formed in the selective growth of the epitaxial layer 45. The subsequent steps are similar to the step in FIG. 6E for the fifth embodiment and the subsequent steps (FIGS. 11C and 11D).

When a MOS transistor having a gate oxide film of thickness 4 nm was formed on the portion of the epitaxial layer 43 in the element region obtained as described above and was examined for its current and voltage characteristics, no hump was observed and excellent transistor characteristics were obtained. In addition, when 100 MOS transistors were produced within a wafer surface and evaluated, no abnormal leak current was observed. Furthermore, no crystal defect was found in at the ends of the element isolating regions. This is due to the lack of stress concentration.

Eleventh Embodiment

Figure 12:
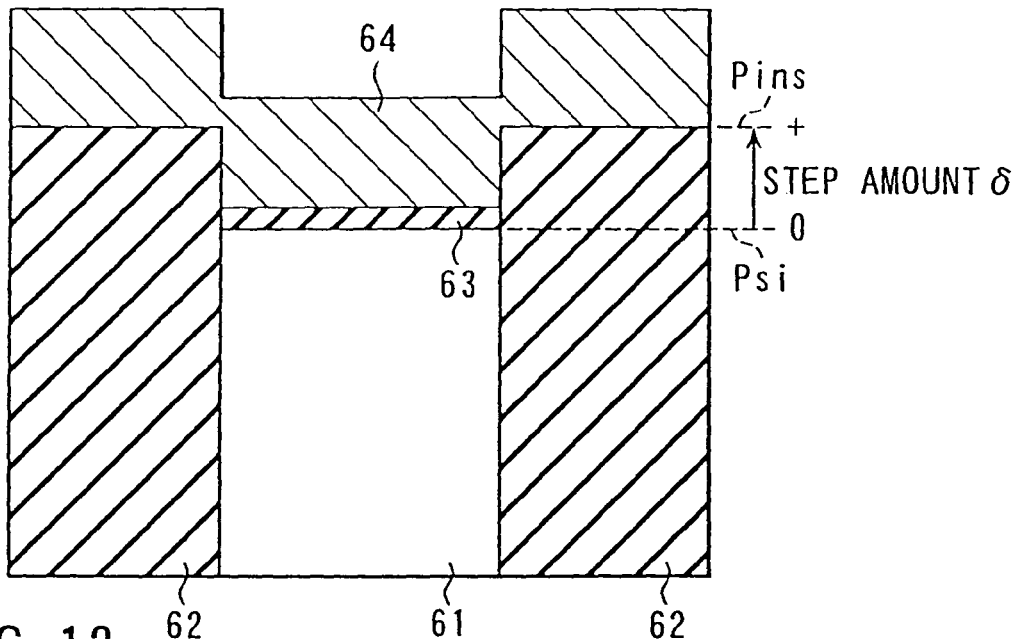
FIG. 12 is a sectional view useful in explaining a MOS transistor according to an eleventh embodiment of the present invention.

FIG. 12 is a sectional view useful in explaining a MOS transistor according to an eleventh embodiment of the present invention. This is a sectional view of a surface parallel with a channel width direction.

In the figure, reference numeral 61 denotes a silicon layer in the element region (a semiconductor layer in a semiconductor region on the substrate surface), reference numeral 62 denotes an element isolating insulating film (a silicon oxide film), reference numeral 63 denotes a gate oxide film, reference numeral 64 denotes a gate electrode, reference $P_{Si}$ denotes the position of a top surface of the silicon layer 61 relative to a substrate (not shown), and reference $P_{ins}$ denotes the position of a top surface of the element isolating insulating film 62 relative to the substrate (not shown). The silicon layer 61 is formed using, for example, any of the first to tenth embodiments. The substrate may be either a normal silicon substrate or an SOI substrate.

This embodiment differs from the prior art in that the height (step amount) δ of the top surface position $P_{Si}$ relative to the top surface position $P_{ins}$ is set to be at least three times as large as the thickness $t_{OX}$ of the gate oxide film 63 and 50 nm or less ($3t_{OX} \leq δ \leq 50$ nm).

The reason why $3t_{OX} \leq δ \leq 50$ nm is set is that variations in device characteristics, particularly, variations in threshold voltage $V_{th}$ can be reduced compared to the prior art, as described below. This provides margins for the manufacturing process. In addition, the oxide film has a larger thickness in corners of the element forming regions, thereby mitigating the adverse effects of variations in step amount δ on corner transistors.

Figure 13:
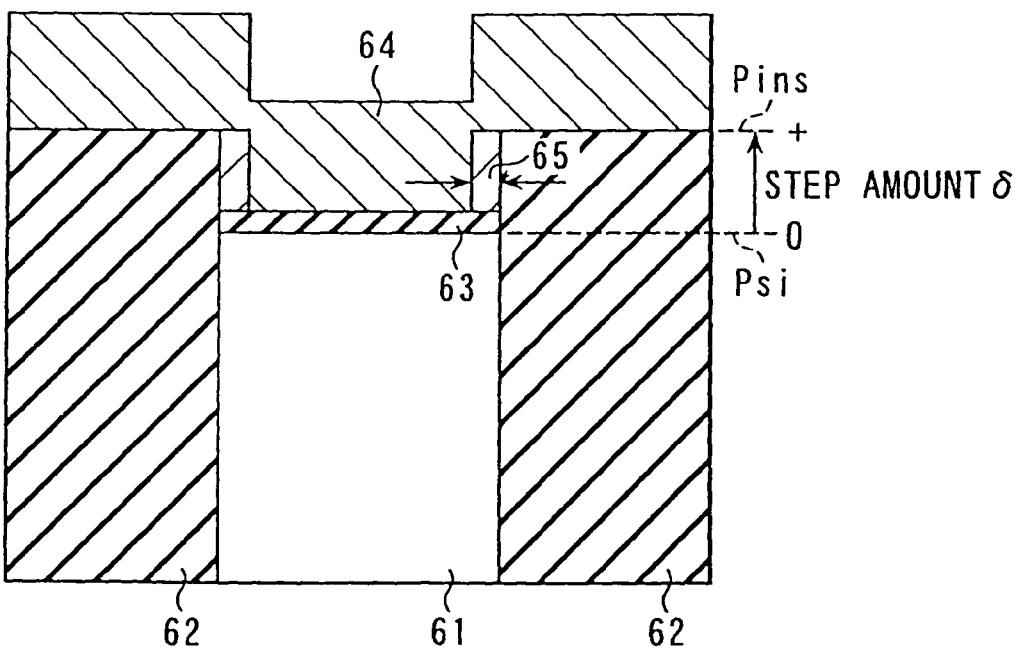
FIG. 13 is a sectional view showing a MOS transistor obtained by improving the MOS transistor in FIG. 12.

FIG. 13 shows a MOS transistor obtained by improving the MOS transistor in FIG. 12. In this MOS transistor, the element isolating insulating film 62 is formed beyond the element isolating region and on the silicon layer 61. The channel-width-wise dimension 65 of the portion of the element isolating insulating film 62 on the silicon layer 61 is larger than or equal to the thickness of the gate oxide film 63, and the channel-width-wise dimension of the gate electrode 64 is correspondingly small.

Figure 14:
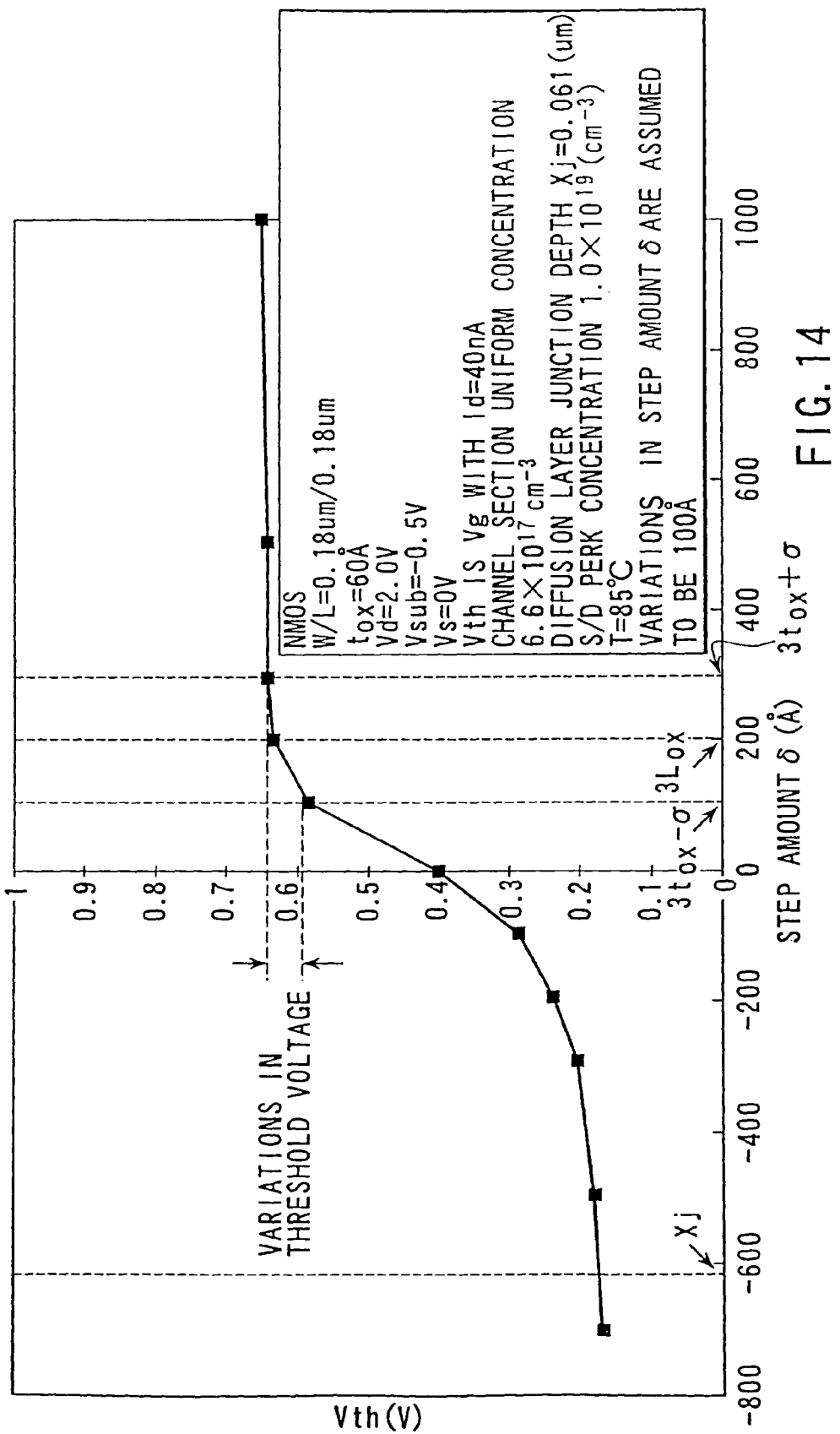
FIG. 14 is a graph showing results of analysis of the relationship between step amount δ and threshold voltage $V_{th}$ using a three-dimensional device simulator.

FIG. 14 shows results of analysis of the relationship between the step amount δ and the threshold voltage $V_{th}$ using a three-dimensional device simulator. In contrast to the MOS transistor according to this embodiment, a MOS transistor of step amount δ≦0 is of a type where the top surface position $P_{ins.}$ is at the same level as the top surface position $P_{Si}$ or is below the same.

FIG. 14 also shows simulation conditions. The other conditions will be described below. The dimension 65 is the same as the thickness of the gate oxide film 63. In addition, the silicon layer 61 has a p-type impurity concentration (hereafter referred to as a "substrate concentration") of $6.6 \times 10^{17}$ cm$^{-3}$, the gate oxide film 63 has a thickness of 6 nm, the gate electrode 64 comprises a polysilicon film containing phosphorous of concentration $7.0 \times 10^{19}$ cm$^{-3}$, the embedded portion of the element isolating insulating film 62 has a thickness (a trench depth) of 300 nm, and the gate oxide film 63 and the element isolating insulating film 62 each comprise a TEOS film (a dielectric constant: 3.9).

FIG. 14 shows that the variations in threshold voltage $V_{th}$ associated with the step amount δ decrease in a region of 20 nm≦δ. This is because a decrease in threshold voltage $V_{th}$ caused by the adverse effects on the corner transistors can be effectively avoided in this region. If the step amount δ is substituted with the thickness $t_{OX}$ of the gate oxide film 63, then the above unequality will be $3t_{OX} \leq \delta$.

FIG. 14 also shows that the variations in threshold voltage $V_{th}$ associated with the step amount δ further decrease in a range exceeding 30 nm. An excessively large step amount δ, however, may make the exposure out of focus or leave unwanted gate polysilicon on the side walls of the opening in the element region, resulting in a short circuit. In view of these points of the process, the upper limit of the step amount is preferably 100 nm and more preferably 50 nm or less.

With a structure of step amount δ≦0, the step amount δ≦10 nm is preferred, as described below.

According to this embodiment, when the step amount δ is selected to be between 20 and 30 nm, even if the step amount δ, which varies depending on process variations, varies by about 10 nm in terms of a value σ, the adverse effects on the threshold voltage $V_{th}$, a device characteristic, that is, the variations in threshold voltage $V_{th}$ can be controlled to 50 mV or lower.

The controllability of the threshold voltage $V_{th}$ can also be improved to prevent off leak currents and variations in saturation current.

Additionally, implementation of the present implement requires no additional process. The only process parameter to be controlled is the step amount δ. Specifically, only the amount of CMP required for the insulating film used to isolate the element, or the like needs to be controlled. Consequently, the yield can be increased while maintaining conventional process costs, thereby reducing manufacturing costs.

In this embodiment, the gate oxide film has a thickness of 6 nm, but even if the film is less than 6 nm in thickness, the variations in threshold $V_{th}$ can be reduced by setting the step amount δ between $3t_{OX}$ and 50 nm. If the variations are so large that standard deviation σ of the step amount δ is larger than 10 nm, the set range of the step amount is shifted by σ to between $\sigma + 3t_{OX}$ and σ+50 nm or the like, in order to compensate for the large variations.

The trend shown in FIG. 14 does not depend on the depth of the element isolating groove, so that the depth of the element isolating groove can be set at an arbitrary value.

Figure 15:
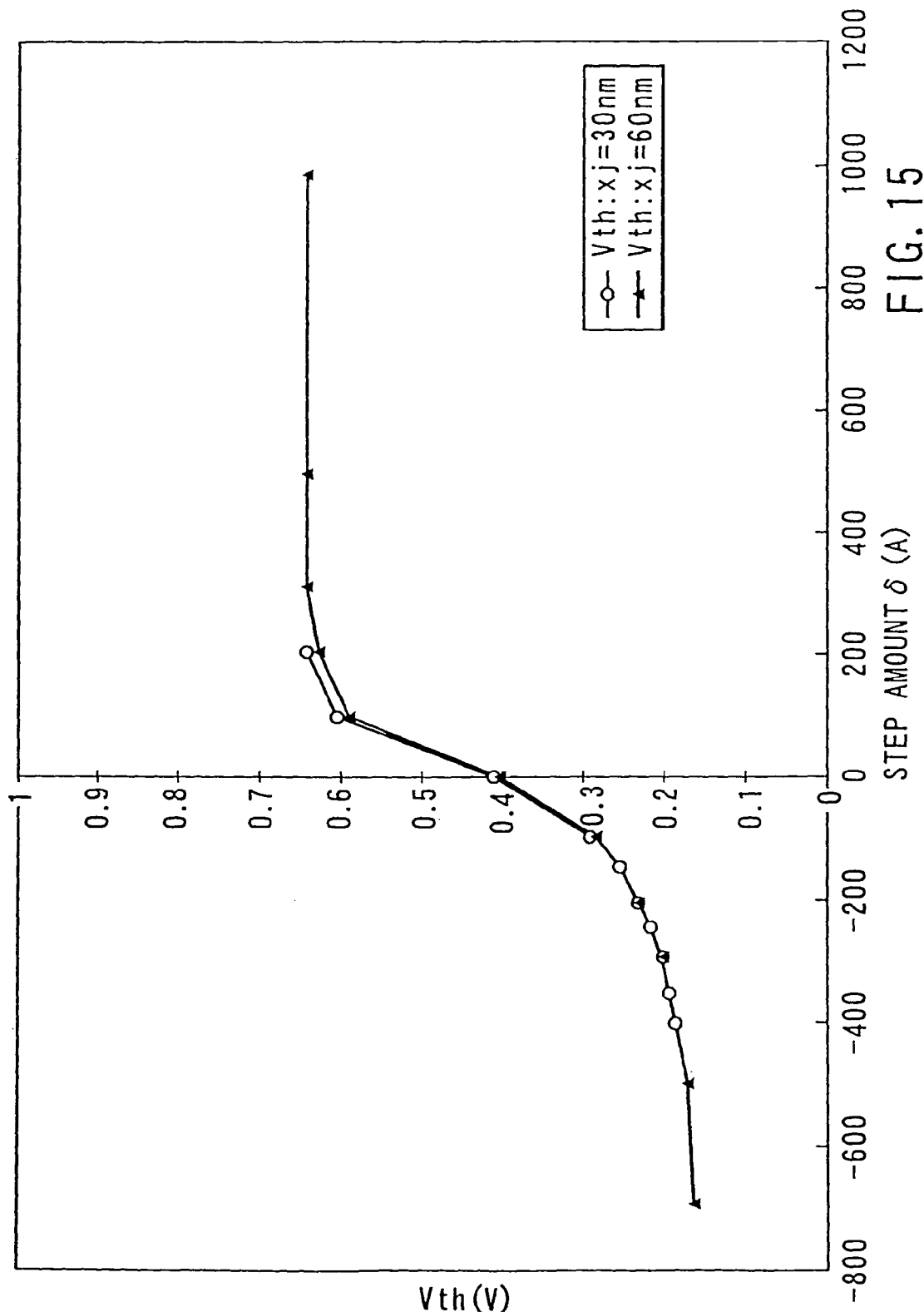
FIG. 15 is a graph showing results of analysis of the relationship between the step amount δ and the threshold voltage $V_{th}$ for MOS transistors of different junction depths $X_j$.

FIG. 15 shows results of analysis of the relationship between the step amount δ and the threshold voltage $V_{th}$ for MOS transistors of different junction depths $X_j$. This figure indicates that the trend shown in FIG. 14 does not depend on the junction depth $X_j$. Thus, the junction depth $X_j$ can be set at an arbitrary value.

Figure 16:
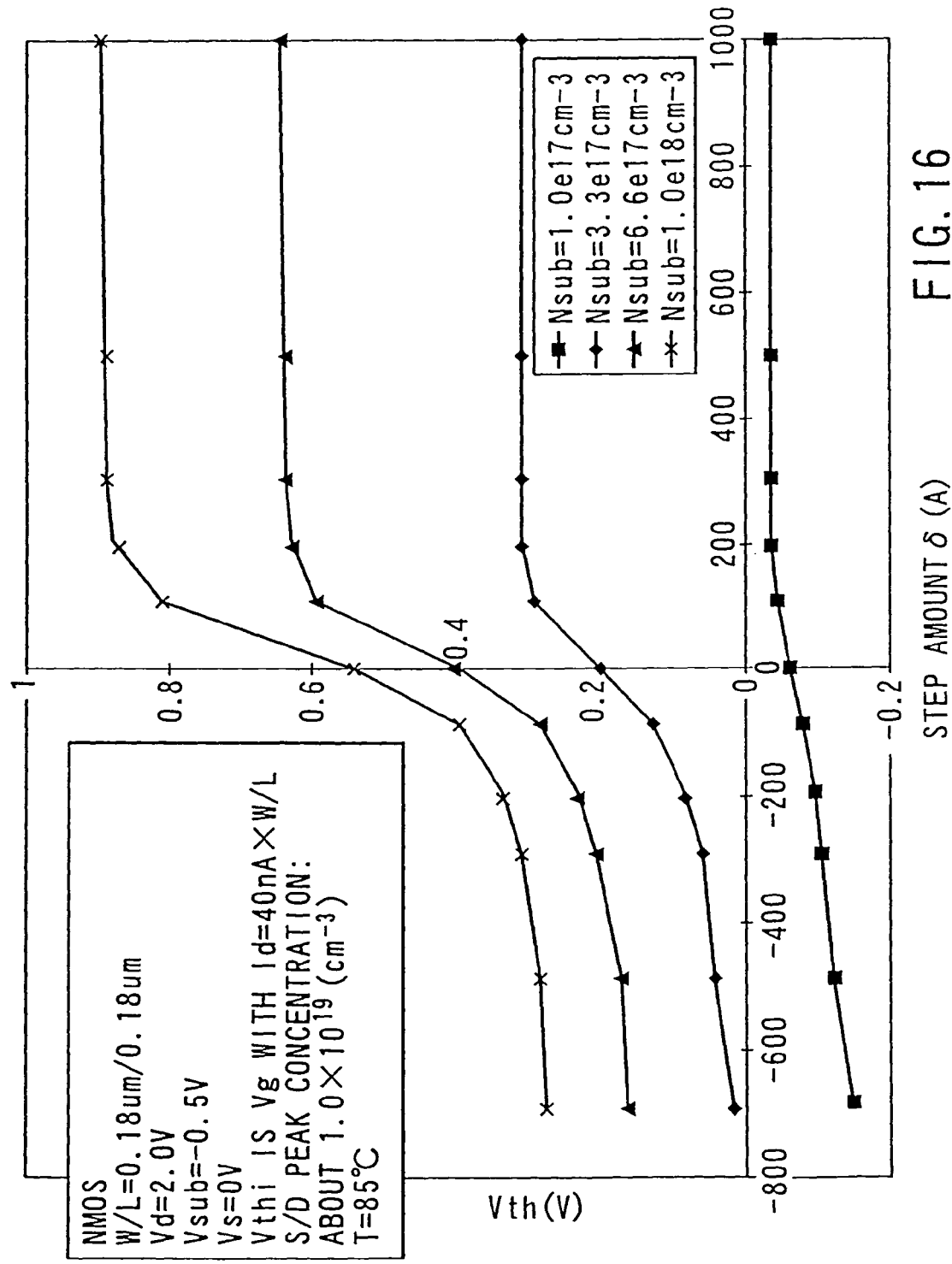
FIG. 16 is a graph showing results of analysis of the relationship between the step amount δ and the threshold voltage $V_{th}$ for MOS transistors of different substrate concentrations $N_{sub}$.
Figure 23:
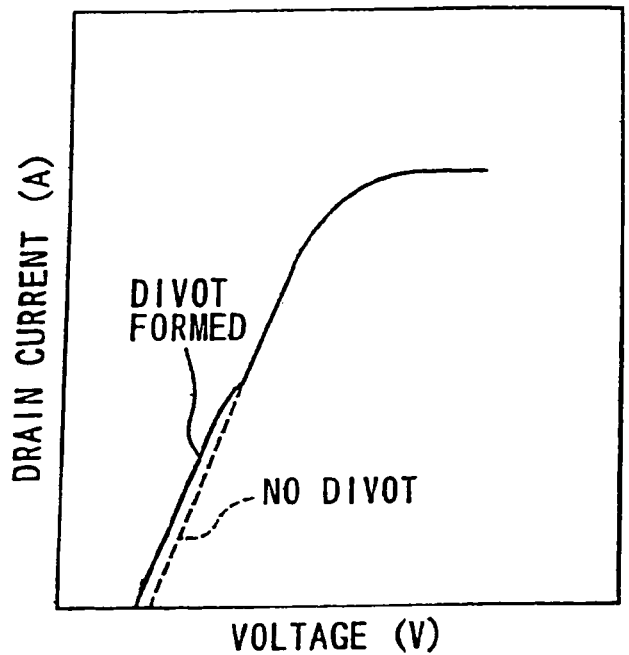
FIG. 23 is a characteristic diagram showing the dependency of a drain current on data voltage to explain problems associated with divots.
Figure 24:
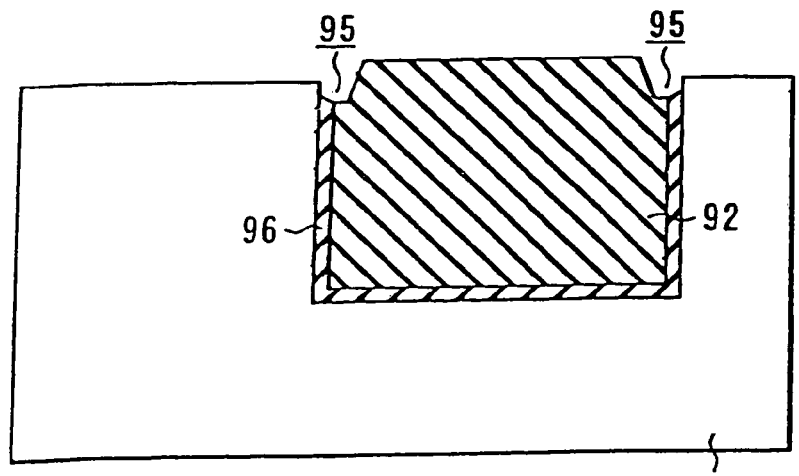
FIG. 24 is a sectional view useful in explaining problems with another conventional element isolating method based on the STI.
Figure 25:
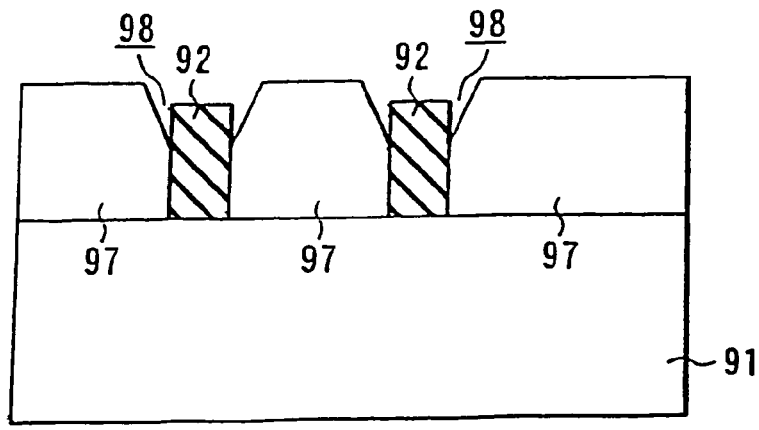
FIG. 25 is a sectional view useful in explaining problems with yet another conventional element isolating method based on the STI.

FIG. 16 shows results of analysis of the relationship between the step amount δ and the threshold voltage $V_{th}$ for MOS transistors of different substrate concentrations $N_{sub}$. This figure indicates that the trend shown in FIG. 14 does not depend on the substrate concentration $N_{sub}$. If the substrate concentration has a value different from that in this embodiment or exhibits a certain distribution, the variations in threshold voltage $V_{th}$ can be reduced by setting the step amount δ between $3t_{OX}$ and 50 nm.

FIG. 16 further indicates that even if the step amount δ≦0 nm, that is, even if the top surface position $P_{Si}$ is higher than the top surface position $P_{ins.}$, the variations in threshold voltage $V_{th}$ can be controlled to 50 mV or lower when δ≦10 nm, by controlling the standard deviation of the step amount δ to about δ/10.

Figure 26:
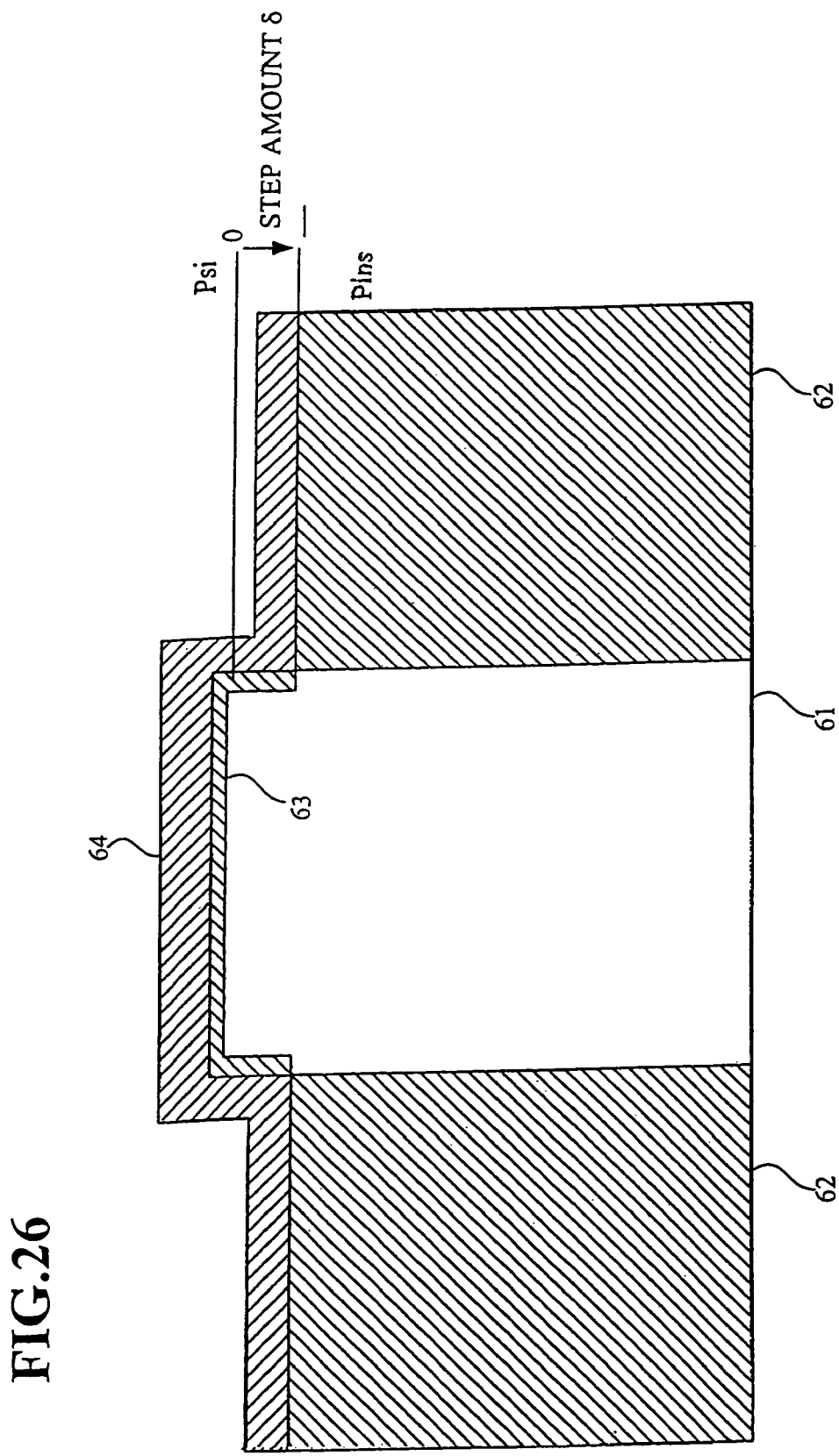
FIG. 26 is a sectional view showing a MOS transistor structure with a negative step amount.

In a structure with a negative step amount, as shown in FIG. 26, that is, a structure with the gate electrode 64 formed on gate insulating film 63 surrounding the element region, a rapid decrease in threshold voltage $V_{th}$ is observed while the gate extended in the vertical direction due to an increase in step amount is contributing to the depletion of the corner portions. Once the gate length, determined by the substrate concentration, the thickness of the oxide film, or the like, has exceeded a fixed value, that gate only turns on vertical transistors and does not affect the corner portions.

Twelfth Embodiment

First, the basic principle of the present invention will be described. FIG. 17A is a top view showing a MIS transistor and its peripheral planar configuration. FIG. 17B is a sectional view taken along line 17B-17B' in FIG. 17A.

In these figures, reference numeral 71 denotes a semiconductor substrate (a silicon substrate or the like), reference numeral 72 denotes an element isolating insulating film of the STI structure, reference numeral 73 denotes a gate insulating film, reference numeral 74 denotes a gate electrode, and reference numeral 75 and 76 denote source and drain regions.

As shown in the figures, an element region of the MIS transistor is formed in a projection (the width of the projection in the channel width direction is denoted by W) on a surface of a semiconductor substrate 71, and an element isolating insulating film 72 formed in a recess around the element region has its top surface lower than a top surface of the projection.

Since a top surface of the element isolating insulating film 72 is lower than a top surface of the projection, a channel is formed in a step region between the projection and the recess, and current density increases near corners of the projection due to field concentration. Such an increase in current density near the corners is conventionally known.

FIG. 17C shows current density Id per unit channel width between the source and drain of the above described MIS transistor. The width of each region near the step portion where the current density per unit channel width increases is denoted (first regions) is defined as $W_c$. The current density per unit channel width in each region surrounded by the first regions where there is no increase in current density (second regions) is defined as $I_{df}$.

The amount of current Ic in each first region near the step portion is expressed by:

$$Ic = \int_0^{W_c} Id(x) = (1+\alpha)Wc \cdot Idf$$

That is, the amount of current is expressed in terms of an increase in effective (assumed) channel width in the case where the first region is replaced with a structure equivalent to the second region.

FIGS. 18A to 18B illustrate the concept of the above equation. As shown in FIG. 18A, an increase in current amount ΔI in the first region is $\alpha Wc \cdot Idf$, so that in an assumed transistor where the channel region is comprised only of the structure equivalent to the second regions (FIG. 18B), the channel width increases by $2\alpha Wc$.

Accordingly, the total amount of current I through the MIS transistor shown in FIGS. 17A to 17C (this amount is equal to the total amount of current through the assumed transistor shown in FIGS. 18A to 18B) is expressed by:

$$I = 2I_c + (W - 2W_c)I_{df} = (2\alpha W_c + W)I_{df}$$

Based on the above described point, a preferred embodiment of the present invention will be described with reference to FIGS. 19A to 19C.

FIG. 19A is a top view of a MIS type semiconductor element and its peripheral planar configuration. FIG. 19B is a sectional view taken along a line 19B-19B in FIG. 19A. FIG. 19C is a sectional view taken along a line C-C in FIG. 19A.

In these figures, reference numeral 71 denotes a semiconductor substrate (a silicon substrate or the like), reference numeral 72 denotes an element isolating insulating film of the STI Structure, reference numeral 73 denotes a gate insulating film, reference numeral 74 denotes a gate electrode, reference numerals 15a and 76a denote source and drain regions (extension regions) containing impurities of a relatively low concentration, reference numerals 15b and 76b denote source and drain regions containing impurities of a relatively high concentration, and reference numeral 77 denotes a side wall insulating film formed on side walls of the gate electrode 74. The gate electrode 74 is, for example, a metal gate electrode, a polysilicon gate electrode, a polymetal gate electrode, or a polycide gate electrode.

As shown in FIGS. 19A to 19C, the semiconductor substrate 71 has a plurality of projections (the number of projections is defined as n and the width of each projection in the channel width direction is defined as W) formed thereon. A recess around the projections (the width of each recess in the channel width direction is defined as G) each have the element isolation insulating film 72 formed therein, and a top surface of each element isolating insulating film 72 is lower than a top surface of each recess. In addition, to maximize the current density in the corner portions of the step region, the element isolating insulating film 72 has its top surface formed at a depth larger than those of portions of the source and drain regions 75a and 76a near each gate electrode 74. That is, the element isolating insulating film 72 has its top surface formed to be deeper than the extension region.

In this manner, the example shown in FIGS. 19A to 19C is structured to arrange in the channel width direction a plurality of structures one of which is shown in FIGS. 17A to 17C. In this structure, channels are formed in the top surface regions of the projections and in the step regions between the projections and the recess, and are each divided into n in the channel width direction by the element isolating insulating film 72 formed in the recess.

In the description shown above and below, the overall insulating film surrounding the projections is referred to as the element isolating insulating film 72 for convenience, but in the region between the adjacent projections, the element isolating insulating film 72 acts as an insulating film for separating the channel region within the same element.

The current density of each channel region into which the channel region within the same element is divided is as shown in FIG. 18A, as in the example shown above. Thus, as in the example shown above, the width of each region near the step portion where the current density per unit channel width increases (first regions) is defined as $W_c$ and the current density per unit channel width in each region surrounded by the first regions where there is no increase in current density (second regions) is defined as $I_{df}$, then the amount of current through each channel region is expressed by:

$$I = (2\alpha W_c + W)I_{df}$$

Accordingly, the total amount of current It flowing between the source and drain of the MIS semiconductor element shown in FIGS. 19A to 19C is expressed by:

$$It = n(2\alpha W_c + W)I_{df}$$

Then, the sum of the widths of the recess in the channel width direction is defined as Gt (=(n−1)G) and the sum of the widths of the projections in the channel width direction is defined as Wt (=nW). A semiconductor element is assumed wherein its channel length L is equal to that of the MIS type semiconductor element shown in FIGS. 19A to 19C, wherein the density of a current through the channel region (the current density is constant in the channel width direction) is equivalent to that ($I_{df}$) of a current through the second regions of the MIS transistor element shown in FIGS. 19A to 19C, and wherein the total current through the channel region is equivalent to that through the channel region of the MIS transistor element shown in FIGS. 19A to 19C. An assumed channel width of this assumed semiconductor element is defined as $W_t$.

Then, the total amount of current through the channel region of the assumed semiconductor element (that is, the total amount of current through the channel region of the MIS type semiconductor element shown in FIGS. 19A to 19C) is given by:

$$I_t = W_t \cdot I_{df} = n(2\alpha W_c + W)I_{df}$$

On the other hand, as a semiconductor element to compare with the MIS type semiconductor element shown in FIGS. 19A to 19C, a semiconductor element is assumed wherein its channel length is equal to that of the MIS type semiconductor element shown in FIGS. 19A to 19C, wherein its channel region is comprised only of a region equivalent to the second regions of the MIS type semiconductor element shown in FIGS. 19A to 19C (that is, the channel region is not divided by the recess), and wherein its channel width is equal to the channel-width-wise width Wr (=Wt+Gt) of the MIS type semiconductor element shown in FIGS. 19A to 19C.

In this case, the total amount of current $I_r$ through the channel region of the comparative semiconductor element is given by:

$$I_r = W_r \cdot I_{df} = (W_t + G_t)I_{df}$$

The condition that the total amount of current through the channel region of the MIS type semiconductor element shown in FIGS. 19A to 19C increases above that of current through the channel region of the comparative semiconductor element is:

$$I_t(=W_i \cdot I_{df}) > I_r(=(W_t+G_t)I_{df}).$$

Thus, the following expression holds:

$$W_i \cdot I_{df} > (W_t+G_t)I_{df}$$

thus, the above condition is expressed by:

$$W_i - W_t > G_t.$$

In addition, $W_i$, $W_t$, and $G_t$ are expressed by:

$$W_i = n(2\alpha W_c + W),$$

$$W_t = nW,$$

$$G_t = (n-1)G.$$

Consequently, the above described condition is expressed by:

$$n \cdot 2\alpha W_c > (n-1)G.$$

The inventor has determined typical values of $\alpha$ and $W_c$ through simulation. The channel length L was 0.1 μm, the thickness $T_{OX}$ of the gate insulating film was 2.7 nm, and the radius of curvature of the corner at the step portion was 30 nm. Under these conditions, the value $\alpha$ was about 4 and the value $W_c$ was about 30 nm. Accordingly, if the number of divisions n is large, the current amount can be increased compared to a comparative semiconductor element of an equivalent element-occupied region, by setting the recess width G at about 240 nm or less.

Although in the example shown in FIGS. 19A to 19C, the projections are separated by the isolating insulating film, the adjacent projections may be connected together at one or more points. That is, the channel regions each formed in a corresponding one of the adjacent projections have only to be separated by the isolating insulating film formed in the corresponding recess, and the projections 20 are not necessarily be completely separated mutually. By connecting the adjacent projections together in an appropriate region other than the corresponding adjacent channel regions, the source regions mutually separated in the example in FIGS. 19A to 19C can be formed into a common source region, while the drain regions mutually separated in the same example can be formed into a common drain region. By providing a common source region and a common drain region, electrodes can be led from these regions easily.

In order to improve the performance of the transistor, in the embodiment for reducing the variations in threshold voltage, the technique for reducing the variations in threshold voltage according to the present invention may be combined as appropriate with the technique for reducing resistance as described in the prior art. This can further improve the performance of the transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate having on its surface a recess and at least one projection formed in the recess, the projection having a channel region;
an element isolating insulating film formed in the recess;
a MIS type semiconductor element formed on said semiconductor substrate and including a gate electrode formed on said channel region of said projection via a gate insulating film, and a source and a drain regions formed to pinch said channel region of said projection therebetween, wherein:
a channel region of said MIS type semiconductor element is formed to reach said at least one projection located adjacent to the MIS type semiconductor element in its channel width direction via said recess, and a top surface of said at least one projection is located higher than the top surface of said element isolating insulating film by 20 nm or more and not higher than 30 nm.

2. A semiconductor device comprising:
a semiconductor substrate having a recess and projections formed on its surface;
an element isolating insulating film formed in said recess and having its top surface located below top surfaces of said projections; and
a MIS type semiconductor element using a region of said semiconductor substrate as a channel region and including a gate electrode formed on said channel region via a gate insulating film, and a source and a drain regions formed to pinch said channel region therebetween, wherein:
said channel region of said MIS type semiconductor element is divided into at least two sections in the channel width direction by means of said element isolating insulating film and has first regions near steps between said recesses and said projections and second regions corresponding to the projections between the first regions, and
$W_i - W_t > G_t$ where $G_t$ denotes the sum of the widths of said recess in the channel width direction, $W_t$ denotes the sum of the widths of said projections in the channel width direction, and $W_i$ denotes an assumed channel width of an assumed semiconductor element in which its channel width is equal to that of the MIS type semiconductor element, in which the current density of a current through its channel region is equivalent to that of a current through the second regions of said MIS type semiconductor element, and in which the total current through its channel region is equivalent to that through the channel region of said MIS type semiconductor element.

3. A semiconductor device according to claim 1, wherein the top surface of said isolating insulating film is formed deeper than portions of said source and drain regions near said gate electrode.

4. A semiconductor device according to claim 2, wherein the top surface of said isolating insulating film is formed deeper than portions of said source and drain regions near said gate electrode.

* * * * *